US010886371B2

(12) United States Patent
Tsuji et al.

(10) Patent No.: US 10,886,371 B2
(45) Date of Patent: Jan. 5, 2021

(54) SILICON CARBIDE SEMICONDUCTOR DEVICE

(71) Applicant: FUJI ELECTRIC CO., LTD., Kawasaki (JP)

(72) Inventors: Takashi Tsuji, Matsumoto (JP); Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/389,276

(22) Filed: Apr. 19, 2019

(65) Prior Publication Data

US 2020/0006494 A1 Jan. 2, 2020

(30) Foreign Application Priority Data

Jun. 28, 2018 (JP) .................................. 2018-123719

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02378* (2013.01); *H01L 21/02529* (2013.01);
(Continued)

(58) Field of Classification Search
CPC ......... H01L 21/02378; H01L 21/02529; H01L 21/02634; H01L 21/049; H01L 21/32133; H01L 29/0661; H01L 29/0878; H01L 29/1095; H01L 29/1608; H01L 29/41741; H01L 29/4236; H01L 29/66734; H01L 29/7813
See application file for complete search history.

(56) References Cited

U.S. PATENT DOCUMENTS

2017/0301788 A1* 10/2017 Fukui .................. H01L 29/0661
2017/0352730 A1* 12/2017 Nakamura .......... H01L 29/0615
(Continued)

FOREIGN PATENT DOCUMENTS

JP 2018019045 A 2/2018

*Primary Examiner* — Joseph M Galvin, III
(74) *Attorney, Agent, or Firm* — Rabin & Berdo, P.C.

(57) ABSTRACT

A silicon carbide semiconductor device, including a semiconductor substrate having first and second epitaxial layers. The second epitaxial layer is formed on a first main surface of the semiconductor substrate, and includes first and second semiconductor regions, selectively provided in a surface layer of the second epitaxial layer respectively in the active region and the border region, and a third semiconductor region. The semiconductor device further includes a trench penetrating the first and third semiconductor regions to reach the first epitaxial layer, a gate electrode provided in the trench via a gate insulating film, a first electrode electrically connected to the first and third semiconductor regions, and a second electrode provided at a second main surface of the semiconductor substrate. The second semiconductor region is separate from the first semiconductor region. A portion of the third semiconductor region is exposed at the first main surface of the semiconductor substrate, between the first and second semiconductor regions.

13 Claims, 27 Drawing Sheets

(51) Int. Cl.
*H01L 21/04* (2006.01)
*H01L 21/3213* (2006.01)
*H01L 29/78* (2006.01)
*H01L 29/08* (2006.01)
*H01L 29/10* (2006.01)
*H01L 29/417* (2006.01)
*H01L 29/423* (2006.01)
*H01L 29/66* (2006.01)
*H01L 29/06* (2006.01)

(52) U.S. Cl.
CPC ...... *H01L 21/02634* (2013.01); *H01L 21/049* (2013.01); *H01L 21/32133* (2013.01); *H01L 29/0661* (2013.01); *H01L 29/0878* (2013.01); *H01L 29/1095* (2013.01); *H01L 29/41741* (2013.01); *H01L 29/4236* (2013.01); *H01L 29/66734* (2013.01); *H01L 29/7813* (2013.01)

(56) References Cited

U.S. PATENT DOCUMENTS

2018/0033885 A1    2/2018    Okumura et al.
2018/0138309 A1*    5/2018    Kinoshita .......... H01L 29/66068
2020/0006494 A1*    1/2020    Tsuji .................. H01L 29/0661

* cited by examiner

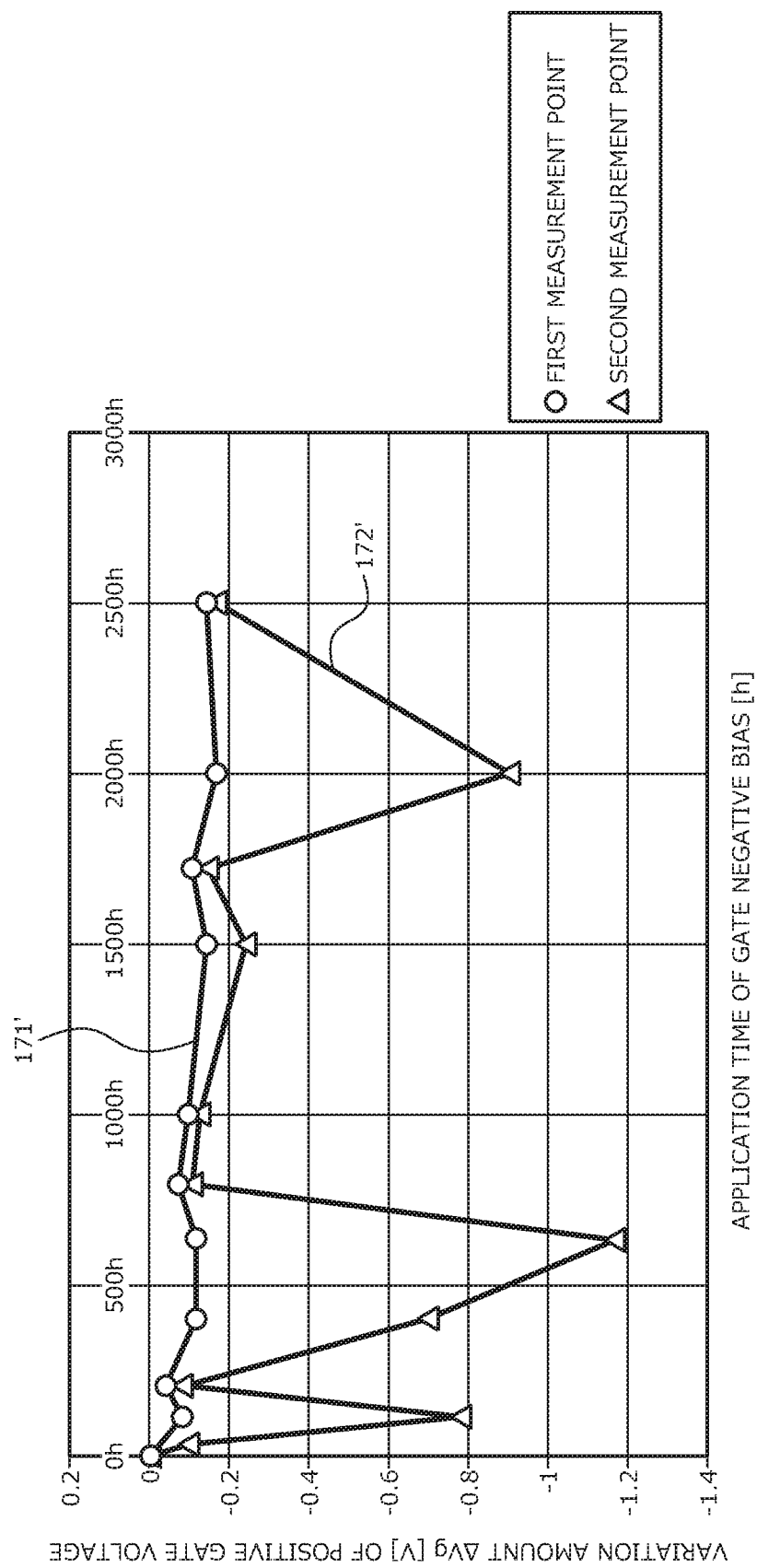

SILICON CARBIDE SEMICONDUCTOR DEVICE

CROSS REFERENCE TO RELATED APPLICATIONS

This application is based upon and claims the benefit of priority of the prior Japanese Patent Application No. 2018-123719, filed on Jun. 28, 2018, the entire contents of which are incorporated herein by reference.

BACKGROUND OF THE INVENTION

1. Field of the Invention

Embodiments of the invention relate to a silicon carbide semiconductor device.

2. Description of the Related Art

Silicon carbide (SiC) is expected to be a semiconductor material that can realize higher breakdown voltage, lower ON resistance, lower loss, faster speed characteristics, higher temperature characteristics, etc. than silicon (Si). A trench gate structure is adopted in semiconductor devices having a MOS (metal oxide semiconductor) gate structure such as an insulated gate bipolar transistor (IGBT) or a metal oxide semiconductor field effect transistor (MOSFET) that includes an insulated gate having a 3-layer structure constituted by a metal, an oxide film, and a semiconductor.

In a trench gate structure, which is a MOS gate structure in which a MOS gate is embedded in a trench formed at a front surface of a semiconductor substrate (semiconductor chip), a channel (inversion layer) is formed along a side wall of the trench, in a direction orthogonal to the front surface of the semiconductor substrate. Therefore, unit cell (constituent unit of an element) density per unit area may be increased as compared to a planar gate structure in which a channel is formed along the front surface of the semiconductor substrate, and since current density per unit area may be increased, a trench gate structure is advantageous in terms of cost. A planar gate structure is a MOS gate structure in which a MOS gate is provided in a plate-like shape on the front surface of the semiconductor substrate.

A structure of a conventional silicon carbide semiconductor device (semiconductor device that uses silicon carbide as a semiconductor material) will be described taking a MOSFET as an example. FIG. 21 is a plan view of a layout of the conventional silicon carbide semiconductor device as viewed from a front surface side of a semiconductor substrate. FIG. 22 is a cross-sectional view of the structure along cutting line AA-AA' in FIG. 21. FIG. 22 depicts a cross-sectional view of a region (hereinafter, border region) 103 between an active region 101 and an edge terminating region 102. FIG. 23 is an enlarged plan view of a portion of FIG. 21. FIGS. 24 and 25 are respectively cross-sectional views along cutting line CC-CC' and cutting line DD-DD' in FIG. 23.

In FIG. 23, a state of a region surrounded by a rectangular frame formed by vertices BB, BB' that are opposing vertices is depicted, the region being near the border region 103 and the active region 101, near a corner of a semiconductor substrate (semiconductor chip) 110. The vertex BB of the rectangular frame is on a corner side of the semiconductor substrate 110 and the vertex BB' is on a center side of the semiconductor substrate 110. The corner of the semiconductor substrate 110 is a vertex of the semiconductor substrate 110 that has a substantially rectangular planar shape. In FIG. 23, a layout of an $n^+$-type source region 124, a $p^+$-type contact region 125, a trench 126, and a $p^+$-type high-concentration region 151 is depicted while a gate insulating film 127 and a gate electrode 128 are not depicted.

The conventional silicon carbide semiconductor device depicted in FIGS. 21 to 25 is a MOSFET that has between the active region 101 and the edge terminating region 102, the border region 103 that includes the $p^+$-type high-concentration region 151. The active region 101 is disposed at a center portion of the semiconductor substrate 110, which includes silicon carbide. Plural unit cells of a vertical MOSFET that has a trench gate structure are disposed in the active region 101 and main current flows through the active region 101 during conduction of the MOSFET. The trench gate structure (the gate electrode 128 embedded in the trench 126 via the gate insulating film 127) is disposed in a striped shape extending along a direction X that is parallel to a front surface of the semiconductor substrate 110.

The edge terminating region 102 is a region between the border region 103 and an end of the semiconductor substrate 110 and surrounds a periphery of the active region 101, via the border region 103. The edge terminating region 102 has a function of mitigating electric field concentration at an end of the active region 101 and maintaining a predetermined breakdown voltage (withstand voltage). The breakdown voltage is a voltage limit at which voltage between a source and a drain does not increase any further even when avalanche breakdown occurs at a pn junction and current increases between the source and the drain. In the edge terminating region 102, for example, a breakdown voltage structure is disposed such as a junction termination extension (JTE) structure 140 constituted by plural $p^-$-type regions 141 and $p^{--}$-type regions 142 where the closer the $p^-$-type regions 141 and the $p^{--}$-type regions 142 are disposed to an outer side (the end of the semiconductor substrate 110), the lower is an impurity concentration thereof.

The border region 103 is constituted by the $p^+$-type high-concentration region 151 that is provided on the entire front surface of the semiconductor substrate 110, between the active region 101 and the edge terminating region 102. The $p^+$-type high-concentration region 151 is provided on a portion (hereinafter, p-type base region extended portion) 123' of a p-type base region 123 of the MOSFET, the p-type base region portion 123' extending in the border region 103. The $p^+$-type high-concentration region 151 is in contact with the $n^+$-type source region 124 and the $p^+$-type contact region 125. Further, the $p^+$-type high-concentration region 151 is in contact with the $p^-$-type region 141 that is innermost (closest to the center portion of the semiconductor substrate 110) of the JTE structure 140. The $p^+$-type high-concentration region 151 has an impurity concentration that is higher than that of the p-type base region 123.

The $p^+$-type high-concentration region 151 has a function of reducing resistance of the p-type base region 123. The resistance of the p-type base region 123 is reduced, whereby electric potential of the p-type base region 123 is prevented from being raised when hole current 162 is pulled out to a source electrode 131, the hole current 162 being mainly generated at the edge terminating region 102 or the end of the active region 101 where high voltage is applied due to avalanche breakdown 161 during an OFF state. For example, when the electric potential of the p-type base region 123 is raised excessively, near a contact where the hole current 162 is pulled out, large electric field is applied to the gate insulating film 127 that has a thin thickness and therefore, leads to shortened life and insulation breakdown of the gate insulating film 12.

Further, the p+-type high-concentration region 151 is disposed adjacent to the n+-type source region 124 of the MOSFET to reduce sheet resistance of the p-type base region 123 of the MOSFET. The p+-type high-concentration region 151 is normally formed by ion implantation of a p-type impurity such as aluminum (Al) and heat treatment (hereinafter, activation annealing) for impurity activation and performed after the ion implantation. Conditions of the ion implantation for forming the p+-type high-concentration region 151, for example, include maximum acceleration energy set to be 350 keV and a total p-type impurity dose amount set to be $5.15 \times 10^{15}/cm^2$.

Reference numerals 121, 111, and 112 are silicon carbide epitaxial layers constituting the semiconductor substrate 110. Reference numerals 122, 122', 129, 132, 133, 143, and 144 are an n−-type drift region, an n-type JFET region, an interlayer insulating film, a gate pad, a drain electrode, an n-type channel stopper region, and a field oxide film, respectively. Reference numeral 130 is a metal film that forms an ohmic contact with a semiconductor portion. Reference numerals 152 and 153 are a conductive layer at a gate electric potential and a gate runner, respectively. Reference numerals 137 and 138 are p+-type regions. Reference character Y is a direction along which the trenches 126 are disposed. Reference character Z is a depth direction of the semiconductor substrate 110.

As such a conventional silicon carbide semiconductor device, a device has been proposed that is a trench gate MOSFET having plural unit cells each constituting one MOS gate having a gate electrode in one trench, where an outermost p+-type contact region extends to the edge terminating region and is in contact with an innermost p-type region of the JTE structure (for example, refer to Japanese Laid-Open Patent Publication No. 2018-019045 (paragraph 0044)). In Japanese Laid-Open Patent Publication No. 2018-019045, an n+-type source region in a mesa region is in contact with a p+-type contact region in the same mesa region or with a p+-type contact region near an end of the trench, whereby all of the n+-type source regions are fixed at a same electric potential.

SUMMARY OF THE INVENTION

According to an embodiment of the present invention, a silicon carbide semiconductor device includes an active region through which main current flows, the active region being provided on a semiconductor substrate of a first semiconductor type, the semiconductor substrate having a first main surface and a second main surface; a termination region surrounding a periphery of the active region; a second-conductivity-type epitaxial layer of a second conductivity type, the second-conductivity-type epitaxial layer constituting a portion of the semiconductor substrate and forming the first main surface of the semiconductor substrate; a first semiconductor region of the first semiconductor type and selectively provided in a surface layer on a first main surface side of the second-conductivity-type epitaxial layer in the active region; a second semiconductor region of the second conductivity type and selectively provided in the surface layer on the first main surface side of the second-conductivity-type epitaxial layer in a border region between the active region and the termination region, the second semiconductor region having an impurity concentration that is higher than that of the second-conductivity-type epitaxial layer; a third semiconductor region of the second conductivity type, the third semiconductor region being a portion of the second-conductivity-type epitaxial layer, excluding the first semiconductor region and second semiconductor region; a fourth semiconductor region of the first semiconductor type, the fourth semiconductor region being a portion of the semiconductor substrate, excluding the second-conductivity-type epitaxial layer; a trench penetrating the first semiconductor region and the third semiconductor region, and reaching the fourth semiconductor region; a gate electrode provided in the trench, via a gate insulating film; a first electrode electrically connected to the first semiconductor region and the third semiconductor region; and a second electrode provided at the second main surface of the semiconductor substrate. The second semiconductor region is disposed separated from the first semiconductor region. A portion of the third semiconductor region of the second-conductivity-type epitaxial layer is exposed at the first main surface of the semiconductor substrate, between the second semiconductor region and the first semiconductor region.

In the embodiment, the trench extends linearly along a first direction that is parallel to the first main surface of the semiconductor substrate. The second semiconductor region, near an end of the trench, is disposed separated from the first semiconductor region along the first direction.

In the embodiment, the trench is disposed in a plurality and has a striped shape extending along the first direction, from the active region into the border region. The first semiconductor region is disposed between trenches that are adjacent among the plurality of trenches. The second semiconductor region is disposed separated from an outermost trench that of the plurality of trenches, is closest to the border region along a second direction that is parallel to the first main surface of the semiconductor substrate and orthogonal to the first direction. A portion of the third semiconductor region of the second-conductivity-type epitaxial layer is exposed at the first main surface of the semiconductor substrate, between the second semiconductor region and the outermost trench.

In the embodiment, the portion of the third semiconductor region exposed at the first main surface of the semiconductor substrate is disposed in the border region and surrounds the periphery of the active region.

In the embodiment, a first distance along the first direction, from the second semiconductor region to the first semiconductor region is at least 0.6 μm.

In the embodiment, a second distance along the second direction, from the second semiconductor region to the outermost trench is at least 0.6 μm.

In the embodiment, the first distance along the first direction, from the second semiconductor region to the first semiconductor region is at least 9.35 μm.

In the embodiment, the trench is disposed in a plurality and has a striped shape extending from the active region into the border region, along a first direction that is parallel to the first main surface of the semiconductor substrate. The first semiconductor region is disposed between trenches that are adjacent among the plurality of trenches. The second semiconductor region is disposed separated from an outermost trench that of the plurality of trenches, is closest to the border region along a second direction that is parallel to the first main surface of the semiconductor substrate and orthogonal to the first direction. A portion of the third semiconductor region of the second-conductivity-type epitaxial layer is exposed at the first main surface of the semiconductor substrate, between the second semiconductor region and the outermost trench.

In the embodiment, the second distance along the second direction, from the second semiconductor region to the outermost trench is at least 0.6 μm.

In the embodiment, the second semiconductor region has an impurity concentration that is at most $6.4 \times 10^{14}/cm^2$.

In the embodiment, the trench extends from the active region into the border region and terminates at a position that is closer to the active region than is the second semiconductor region.

In the embodiment, the silicon carbide semiconductor device further includes a fifth semiconductor region of the second conductivity type selectively provided in the portion of the third semiconductor region exposed at the first main surface of the semiconductor substrate, the fifth semiconductor region having an impurity concentration that is higher than that of the third semiconductor region. The third semiconductor region is electrically connected to the first electrode, via the fifth semiconductor region.

In the embodiment, the fifth semiconductor region is a diffusion region formed by ion implanting an impurity of the second conductivity type in the second-conductivity-type epitaxial layer.

In the embodiment, the second semiconductor region is a diffusion region formed by ion implanting an impurity of the second conductivity type in the second-conductivity-type epitaxial layer.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 27 is a characteristics diagram depicting a relationship of an amount of variation ΔVg from the time of an initial state of a gate voltage Vg in FIG. 26 and an application period of the gate voltage Vg in an OFF state.

DETAILED DESCRIPTION OF THE INVENTION

Figure 1:
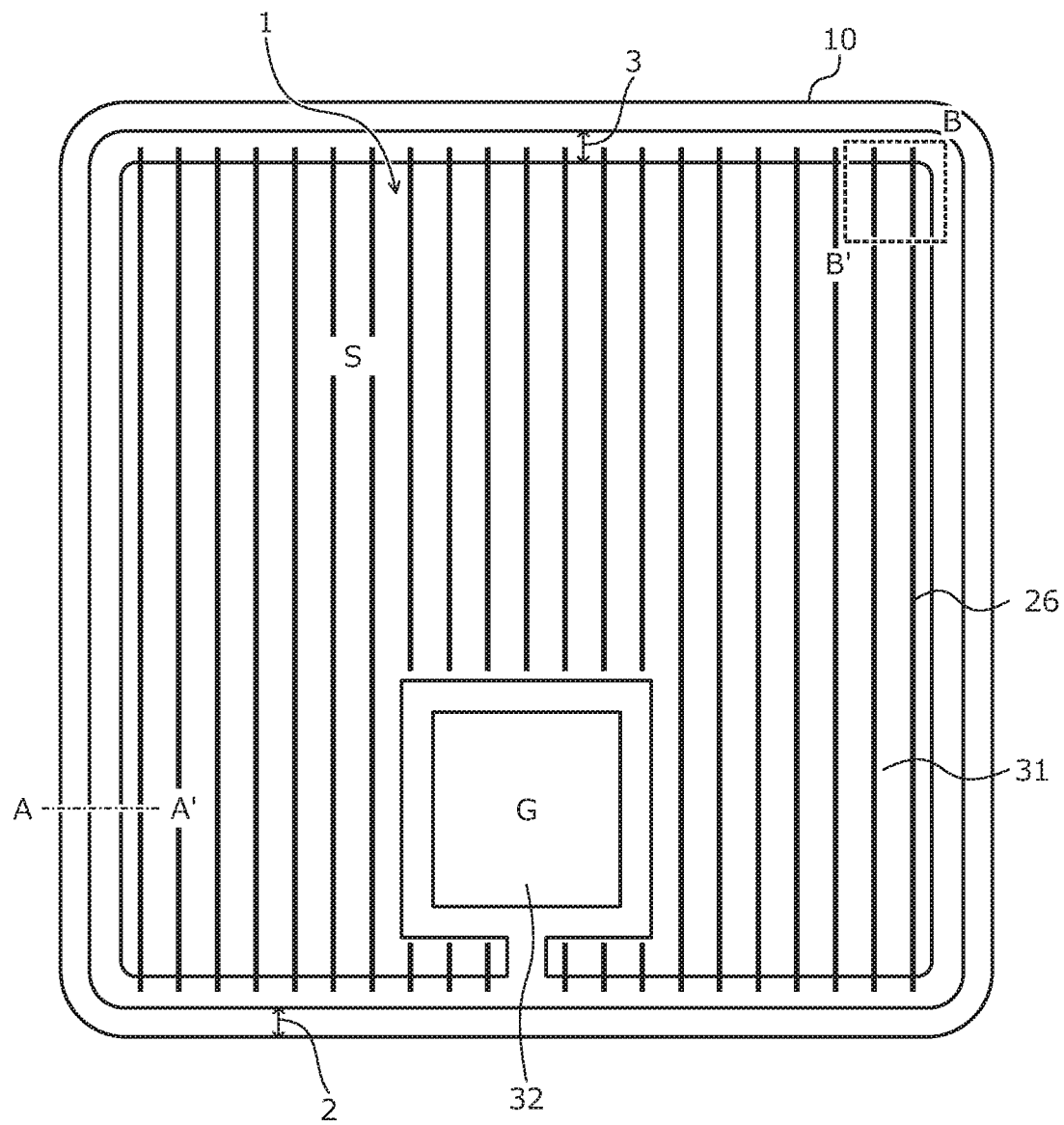
FIG. 1 is a plan view of a layout when a silicon carbide semiconductor device according to a first embodiment is viewed from a front surface side of a semiconductor substrate.

First, problems associated with the conventional techniques will be discussed. In the conventional silicon carbide semiconductor device (refer to FIGS. 21 to 25) described above, when the OFF state is maintained under a condition of the semiconductor substrate 110 becoming a high temperature (for example, about 125 degrees C. or higher), gate voltage Vg (gate voltage Vg<0: hereinafter, negative gate bias) that is negative bias with respect to the electric potential of the source electrode 131 is assumed to be applied to the gate electrode 128 for a long period. In this case, gate threshold voltage Vth fluctuates greatly in a negative direction (direction of becoming lower) as compared to an initial state, conduction occurs by the gate voltage Vg that is low as compared to the initial state, whereby drain current Id begins to flow. Therefore, a gain curve of the drain current Id (refer to FIG. 26) is greatly shifted in a negative direction of the gate voltage Vg as compared to in the initial state.

The initial state is a state in which a total period of application of a negative gate bias to the gate electrode 128 is 0 (zero) V. The drain current Id is a flow of electrons moving from an n+-type drain region (the n+-type starting substrate 121) and toward the n+-type source region 124 during energization. A gain curve of the drain current Id is an increasing curve of the drain current Id that begins to flow when the gate voltage Vg is at least the gate threshold voltage Vth and that further increases accompanying increases of the gate voltage Vg, when the gate voltage Vg (gate voltage Vg≥0: hereinafter, positive gate voltage), which is positive bias with respect to the electric potential of the source electrode 131, is applied to the gate electrode 128 and the gate voltage Vg is increased.

Without regularity in variation from the time of the initial state of the gate voltage Vg, an amount of variation ΔVg of the gate voltage Vg corresponding to a predetermined magnitude of the drain current Id is maximum in the negative direction during a certain application period of the negative gate bias that is applied to the gate electrode 128. Additionally, the amount of variation ΔVg of the gate voltage Vg does not vary in a positive direction as compared to the amount of variation ΔVg of the gate voltage Vg at the time of the initial state thereof. Therefore, when the application period of the negative gate bias that is applied to the gate electrode 128 is assumed as a time axis, the amount of variation ΔVg of the gate voltage Vg fluctuates without any regularity between a maximum value at the time of the initial state when the amount of variation ΔVg is smallest and a minimum value during a certain application period when the amount of variation ΔVg is greatest.

Figure 26:
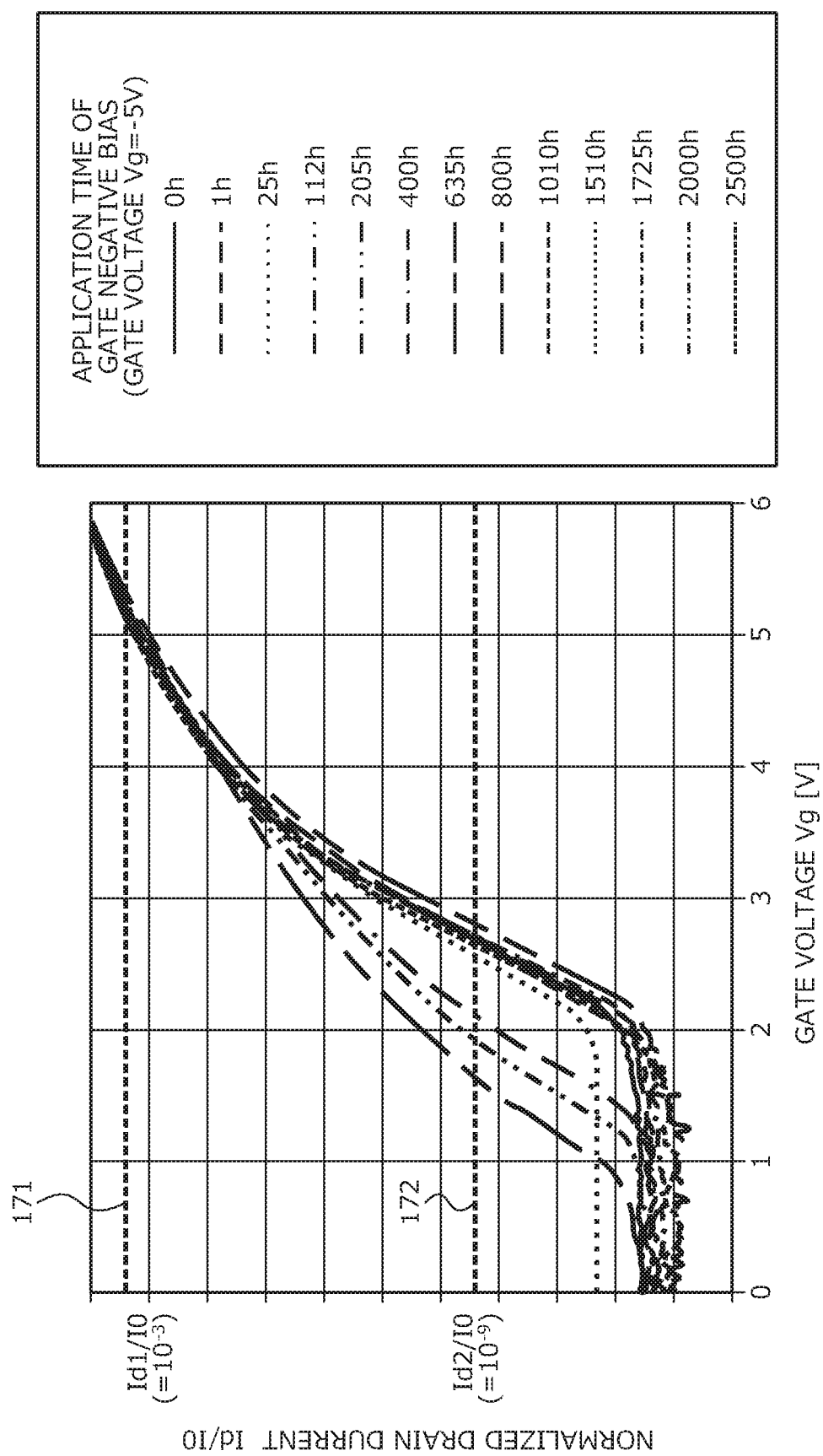
FIG. 26 is a characteristics diagram depicting a region of an initial current rise on a gain curve of a drain current Id of the conventional silicon carbide semiconductor device.

This phenomenon appears remarkably on the gain curve, at a region where the drain current Id rises. Results of verification of this phenomenon are depicted in FIGS. 26 and 27. FIG. 26 is a characteristics diagram depicting a region of an initial current rise on the gain curve of the drain current Id of the conventional silicon carbide semiconductor device. In FIG. 26, a horizontal axis is the gate voltage Vg (positive gate voltage) [V] applied to the gate electrode 128 during energization. In FIG. 26, a vertical axis is normalized drain current normalized by dividing the drain current Id by a rated current I0. In general, the gate threshold voltage Vth is defined as the gate voltage Vg when the normalized drain current (=Id/I0) becomes $10^{-3}$.

A legend in FIG. 26 indicates application times of negative gate bias applied to the gate electrode 128. During application of negative gate bias to the gate electrode 128, voltage (voltage between the source and drain) between the drain electrode 133 and the source electrode 131 is 0 (zero) V. Further, sample "0 h" shown in the legend in FIG. 26 corresponds to the initial state described above. FIG. 27 is a characteristics diagram depicting a relationship of the amount of variation ΔVg from the time of the initial state of the gate voltage Vg (positive gate voltage) in FIG. 26 and the application period of the gate voltage Vg (negative gate bias) in an OFF state. In FIG. 27, a horizontal axis is the application period [hours (h)] of the negative gate bias while a vertical axis is the amount of variation ΔVg from the time of the initial state of the positive gate voltage.

First, plural samples were prepared that were MOSFETs having the structure of the conventional silicon carbide semiconductor device (refer to FIGS. 21 to 25) and negative gate bias was applied to the gate electrode 128 under a condition of the semiconductor substrate 110 becoming a high temperature of 200 degrees C. For these samples, the negative gate bias applied to the gate electrode 128 was −5V (gate voltage Vg=−5V), while the application period of the negative gate bias differed within a range from 0 h to 2500 h. For these samples, at room temperature (for example, about 25 degrees C.), after application of positive gate voltage to the gate electrode 128 and energization, the positive gate voltage was increased and results of measurement of a magnitude [A] of the drain current Id are depicted in FIG. 26.

Further, the amount of variation ΔVg from the time of the initial state of the positive gate voltage, corresponding to predetermined magnitudes Id1/I0, Id2/I0 (in FIG. 26, parts indicated by dashed lines having reference numerals 171, 172) of the normalized drain current Id/I0 are depicted in FIG. 27. FIG. 27 depicts, for example, the amount of variation ΔVg from the time of the initial state of the positive gate voltage at measurement points (hereinafter, first measurement points 171') at which the magnitude of the drain current Id becomes a magnitude Id1/I0 ($=10^{-3}$) that is 1/1000 of the rated current I0 and measurement points (hereinafter, second measurement points 172') at which the magnitude of the drain current Id becomes a magnitude Id2/I0 ($=10^{-9}$) that is 1/1,000,000 of the magnitude Id1 of the drain current Id of the first measurement point 171'.

As depicted in FIG. 27, the positive gate voltage that corresponds to the magnitude of the drain current Id at the first measurement points 171' was 5.2V for all of the samples in which the application period of the negative gate bias that was applied to the gate electrode 128 differed. In other words, the amount of variation ΔVg of the positive gate voltage from the time of the initial state thereof, corresponding to the magnitude of the drain current Id at the first measurement points 171' was substantially 0 (zero) V regardless of whether negative gate bias was applied. In contrast, as compared to the first measurement points 171', the amount of variation ΔVg of the positive gate voltage from the time of the initial state thereof, corresponding to the magnitude of the drain current Id at the second measurement points 172' that are a state in which the positive gate voltage applied to the gate electrode 128 applies the gate voltage Vg that is close to the gate threshold voltage Vth, was a maximum of −1.2V.

From the results depicted in FIG. 27, it is found that characteristics of the gate threshold voltage Vth become unstable, exhibit so-called negative bias temperature instability (NBTI), due to the effects of high temperature and negative gate bias application at regions where the drain current Id rises (in particular, near the second measurement points 172'). In this manner, the gain curve of the drain current Id, as compared to the initial state, is greatly shifted in the negative direction of the gate voltage Vg only in a region where the drain current Id rises.

With such shifting of the gain curve of the drain current Id, a problem arises in that when the gate voltage Vg of 0V or less is applied to the gate electrode 128 and the OFF state is maintained, reverse leak current increases or heat surges and element breakdown occur due to excessive leak current.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
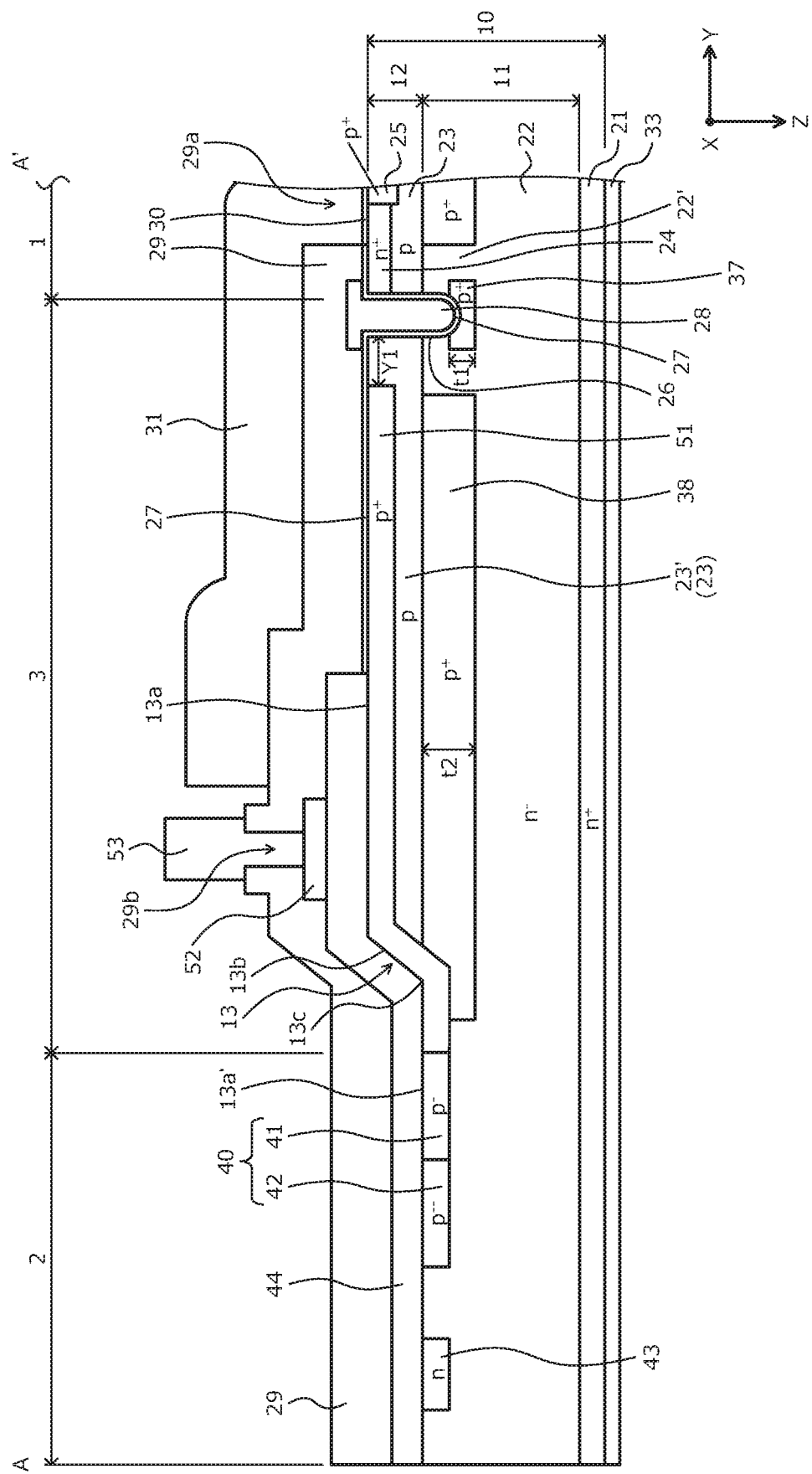
FIG. 2 is a cross-sectional view of a structure along cutting line A-A' in FIG. 1.
Figure 3:
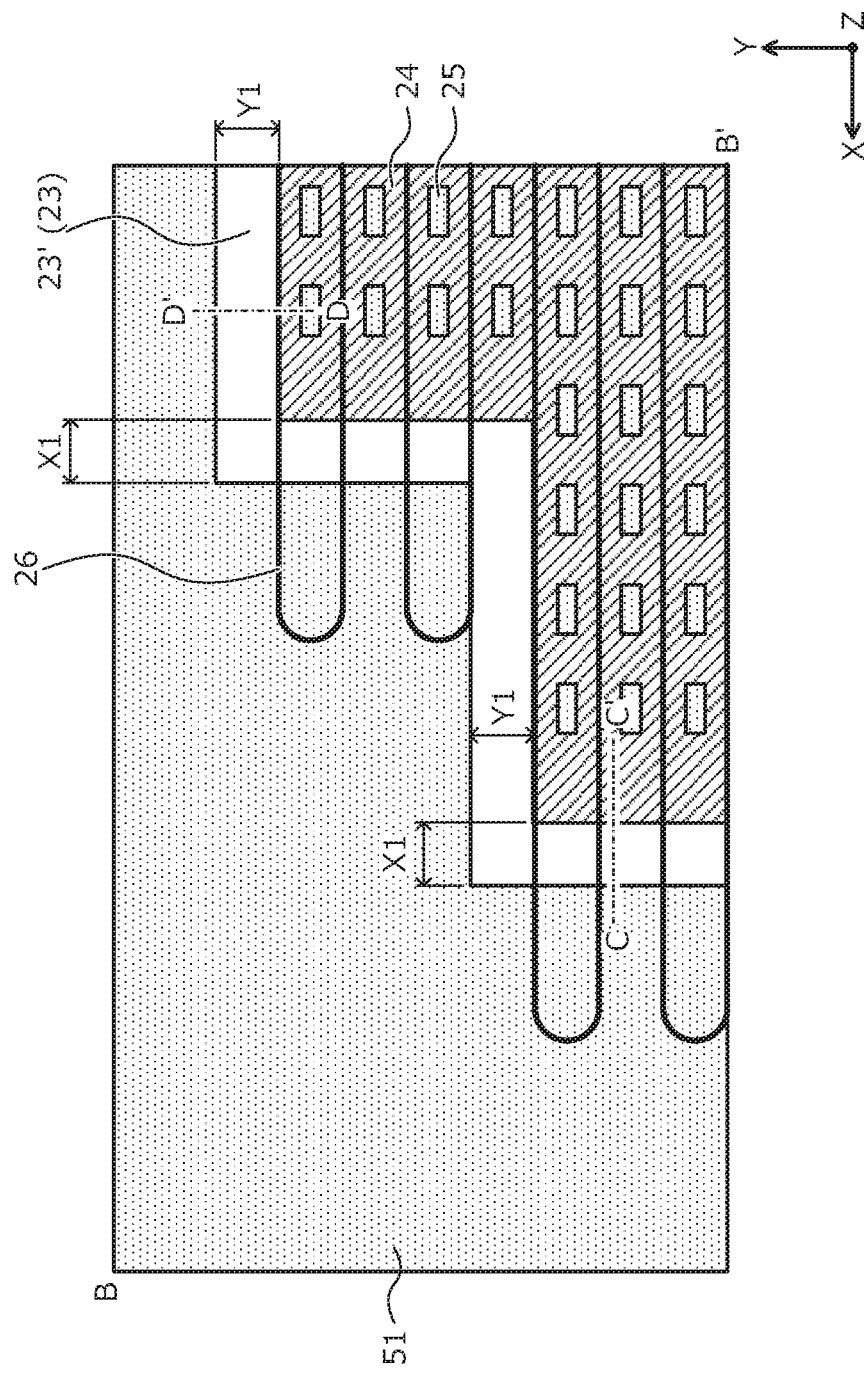
FIG. 3 is an enlarged plan view of a portion of FIG. 1.
Figure 4:
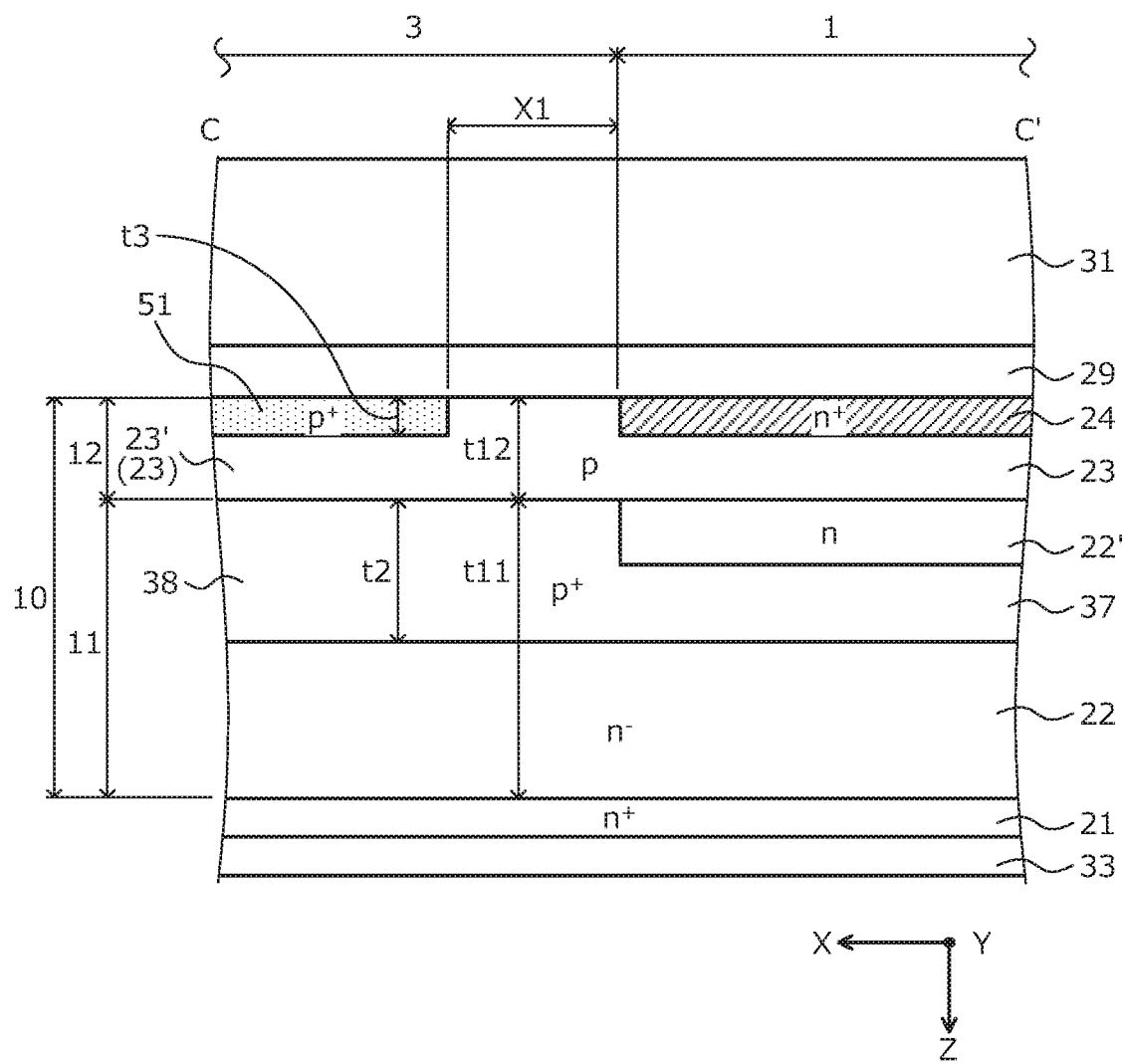
FIG. 4 is a cross-sectional view at cutting line C-C' in FIG. 3.
Figure 5:
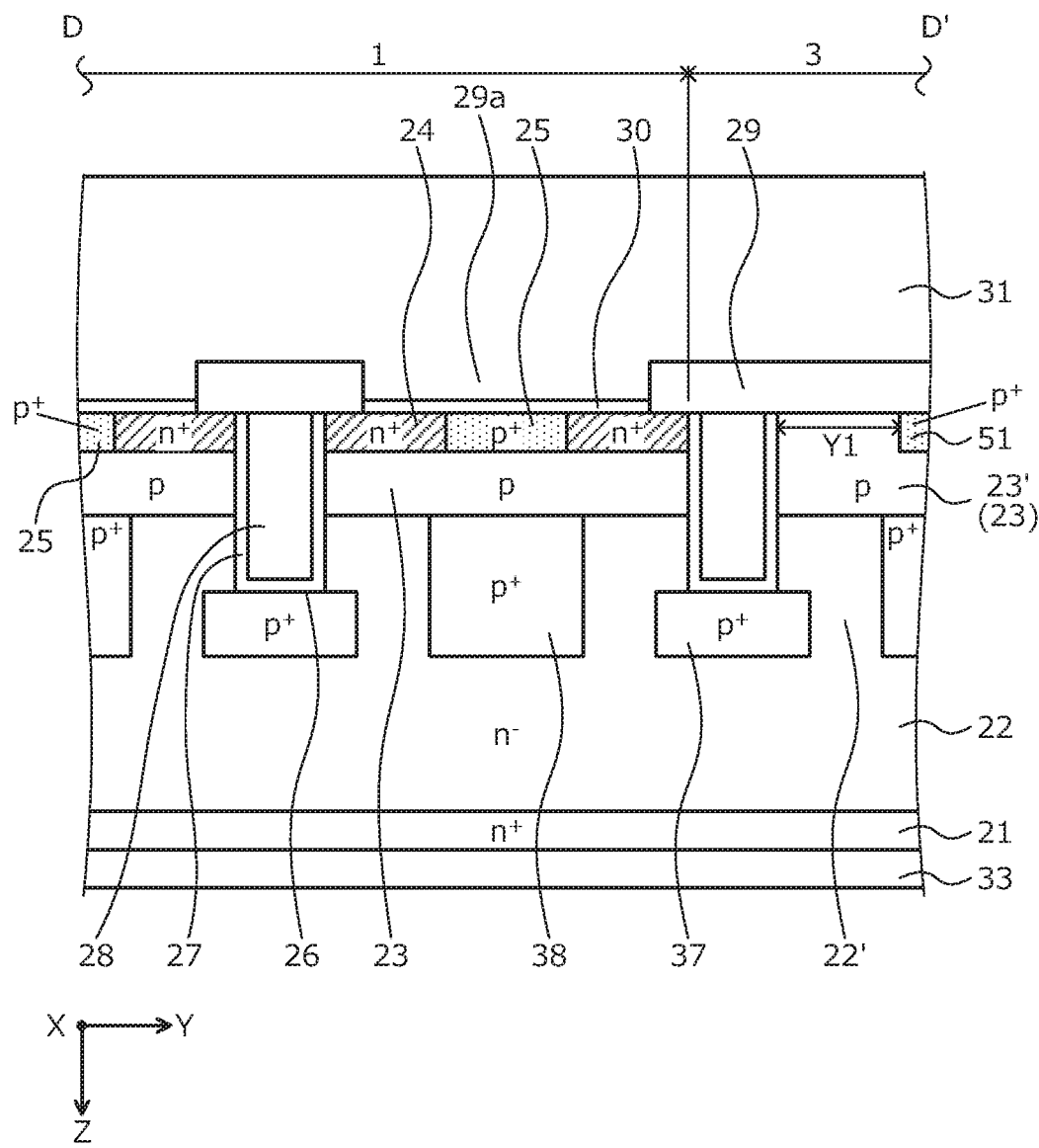
FIG. 5 is a cross-sectional view at cutting line D-D' in FIG. 3.

A structure of the silicon carbide semiconductor device according to a first embodiment (semiconductor device that uses silicon carbide (SiC) as a semiconductor material) will be described taking a MOSFET as an example. FIG. 1 is a plan view of a layout of the silicon carbide semiconductor device according to the first embodiment as viewed from a front surface side of a semiconductor substrate. FIG. 2 is a cross-sectional view of the structure along cutting line A-A' in FIG. 1. FIG. 2 depicts a cross-sectional view of the structure of a region (border region) 3 between an active region 1 and an edge terminating region 2. FIG. 3 is an enlarged plan view of a portion of FIG. 1. FIGS. 4 and 5 are cross-sectional views at cutting line C-C' and cutting line D-D' in FIG. 3, respectively.

In FIG. 3, a state of a region that is surrounded by a rectangular frame formed by vertices B, B' that are opposing vertices depicted in FIG. 1 is depicted, the region being near a border between the active region 1 and the border region 3, near a corner of a semiconductor substrate (semiconductor chip) 10. A vicinity of the vertex B of the rectangular frame is a portion toward the corner of the semiconductor substrate 10 while a vicinity of the vertex B' is a portion toward a center portion of the semiconductor substrate 10. The corner of the semiconductor substrate 10 is a vertex of the semiconductor substrate 10 that has a substantially rectangular planar shape. In FIG. 3, a layout of an $n^+$-type source region (first semiconductor region) 24, a $p^+$-type contact region 25, a trench 26, and a $p^+$-type high-concentration region (second semiconductor region) 51 is depicted while a gate insulating film 27 and a gate electrode 28 are not depicted.

The silicon carbide semiconductor device according to the first embodiment and depicted in FIGS. 1 to 5 is a vertical MOSFET having a trench gate structure that includes between the active region 1 and the edge terminating region 2, the border region 3 that has the $p^+$-type high-concentration region 51. The active region 1 is disposed at the center portion of the semiconductor substrate 10 that includes silicon carbide. In the active region 1, plural unit cells (constituent units of elements) of the vertical MOSFET having the trench gate structure are disposed and during conduction (energization) of the MOSFETs, main current (the drain current Id) flows. The trench gate structure has a MOS gate that is constituted by the gate electrode 28 that is embedded, via the gate insulating film 27, in the trench 26 that reaches a predetermined depth from a front surface 13a of the semiconductor substrate 10.

The active region 1 is a region that is closer to a center (center of the semiconductor substrate 10) than is an outer periphery of the $n^+$-type source region 24 described hereinafter and, for example, has a substantially rectangular planar shape. In a first direction X described hereinafter, the outer periphery of the $n^+$-type source region 24 is an end of the $n^+$-type source region 24 along the first direction X, the $n^+$-type source region 24 being between the trench 26 and an adjacent trench 26, and extending linearly along the trench 26, in the first direction X. In a second direction Y described hereinafter, the outer periphery of the $n^+$-type source region 24 is a border between the $n^+$-type source region 24 and an inner side wall of the trench (outermost trench) 26 that of plural trenches 26, is outermost (nearest an edge of the semiconductor substrate 10) along the second direction Y, the inner side wall being a side wall that is nearest the center of the semiconductor substrate 10, of side walls constituting the trench 26 that is outermost. The edge terminating region 2 is a region that is further outward than a border between the $p^+$-type high-concentration region 51 and a $p^-$-type region 41 of a JTE structure 40 described hereinafter. Herein, expressions such as inner, inward and the like refer to a direction toward the center of the semiconductor substrate 10, while expressions such as outer, outward and the like refer to a direction toward an edge of the semiconductor substrate 10.

The semiconductor substrate 10 is an epitaxial substrate in which silicon carbide epitaxial layers 11, 12 constituting an $n^-$-type drift region (fourth semiconductor region) 22 and a p-type base region (third semiconductor region) 23, respectively, are sequentially formed on a front surface of an $n^+$-type starting substrate 21 that includes silicon carbide and constitutes an $n^+$-type drain region. The semiconductor substrate 10 has, as the front surface 13a, a main surface (first main surface) where the p-type silicon carbide epitaxial layer (second-conductivity-type epitaxial layer) 12 is exposed, and has a main surface (second main surface) where a rear surface of the $n^+$-type starting substrate 21 is exposed. In the active region 1, first and second $p^+$-type regions 37, 38 described hereinafter are each selectively provided in the $n^-$-type silicon carbide epitaxial layer 11. A portion of the $n^-$-type silicon carbide epitaxial layer 11 excluding the first and second $p^+$-type regions 37, 38 constitutes an $n^-$-type drift region 22.

Further, in the active region 1, the $n^+$-type source region 24 and the $p^+$-type contact region 25 are each selectively provided in a surface region (surface layer at the front surface 13a of the semiconductor substrate 10) of the p-type silicon carbide epitaxial layer 12. The $n^+$-type source region 24 is formed by, for example, ion implantation of an n-type impurity such as phosphorus (P) into the p-type silicon carbide epitaxial layer 12. The $p^+$-type contact region 25 and the $p^+$-type high-concentration region 51 are formed by, for example, ion implantation of a p-type impurity such as aluminum (Al) into the p-type silicon carbide epitaxial layer 12. A portion of the p-type silicon carbide epitaxial layer 12 excluding the $n^+$-type source region 24, the $p^+$-type contact region 25, and the $p^+$-type high-concentration region 51 constitutes the p-type base region 23.

The p-type base region 23 extends further outward beyond the active region 1 and terminates at a step 13b of a recess 13 described hereinafter positioned near a border between the edge terminating region 2 and the border region 3. Hereinafter, a portion of the p-type base region 23 extended outward beyond the active region 1 will be referred to as "p-type base region extended portion 23'". In particular, the p-type base region extended portion 23', along the first direction X described hereinafter, is a portion of the p-type base region 23 further outward than is the outer periphery of the $n^+$-type source region 24. The p-type base region extended portion 23', along the second direction Y described hereinafter, is a portion of the p-type base region 23 further outward than the trench 26 that is outermost. The p-type base region extended portion 23' surrounds a periphery of the active region 1 in a substantially rectangular shape.

The trench 26 penetrates the $n^+$-type source region 24 and the p-type base region 23 in the depth direction Z from the front surface 13a of the semiconductor substrate 10 and reaches the $n^-$-type drift region 22. The trench 26 is disposed in a striped shape, extending along the first direction X so that ends of the trench 26 are respectively near opposite edges of the semiconductor substrate 10, the first direction X being parallel to the front surface 13a of the semiconductor substrate 10. The ends of the trench 26 extend outward from the active region 1 and terminate in the border region 3. The ends of the trench 26 may reach the $p^+$-type high-concentration region 51 (refer to FIG. 3). The trench 26 may have a substantially circular planar shape in which the ends thereof are respectively connected with ends of an adjacent trench 26.

In the trench 26, the gate electrode 28 is provided via the gate insulating film 27. The gate electrode 28 disposed in a single trench 26; and adjacent mesa regions separated by the single trench 26 constitute a single unit cell of the MOSFET. A region provided in a mesa region is electrically insulated from the gate electrode 28 by the gate insulating film 27. A mesa region is a region between the trench 26 and an adjacent trench 26. A unit cell of the MOSFET is disposed in plural, in a striped shape that extends along the first direction X. In other words, the p-type base region 23, the $n^+$-type source region 24, the trench 26, the gate insulating film 27, and the gate electrode 28 are disposed in a striped shape that extends along the first direction X.

The $n^+$-type source region 24 is provided at an entire surface of a mesa region in the active region 1, from a side wall of the trench 26 and across the mesa region and reaching a side wall of an adjacent trench 26. The $p^+$-type contact region 25 is disposed interspersed in the $n^+$-type source region 24 at a predetermined interval along the first direction X. The $p^+$-type contact region 25 has a function of reducing contact resistance between a metal film 30 described hereinafter and the $n^+$-type source region 24, and the metal film 30 and the $p^+$-type contact region 25. A contact (electrical contact) between the metal film 30 and a semiconductor portion has voltage-current characteristics that exhibit an ohmic property (linearity) due to the $p^+$-type contact region 25. Therefore, electric potential difference between a source electrode (first electrode) 31 and a semiconductor portion may be reduced.

Reduction of the electric potential difference between the source electrode 31 and a semiconductor portion enables prevention of insulation breakdown of the gate insulating film 27 due to npn parasitic bipolar operation occurring from the $n^+$-type source region 24, the p-type base region 23, and the $n^-$-type drift region 22. The first and second $p^+$-type regions 37, 38 are each selectively provided in the $n^-$-type drift region 22 at positions that from the front surface 13a of the semiconductor substrate 10, are closer to the $n^+$-type starting substrate 21 than is a bottom of the trench 26. The $p^+$-type region 37 is disposed at a position that is closer to the $n^+$-type starting substrate 21 than is the bottom of the trench 26 and opposes the bottom of the trench 26 in the depth direction Z. The bottom of the trench 26 may terminate in the $p^+$-type region 37.

The second $p^+$-type region 38 is disposed in the mesa region, at a position that is closer to the $n^+$-type starting substrate 21 than is the p-type base region 23 and the second $p^+$-type region 38 is in contact with the p-type base region 23. The second $p^+$-type region 38 is disposed separated from the trench 26. The first and second $p^+$-type regions 37, 38 are disposed to repeatedly alternate along the second direction Y that is orthogonal to the first direction X and parallel to the front surface 13a of the semiconductor substrate 10. Provision of the first and second $p^+$-type regions 37, 38 enables suppression of electric field that is applied to the gate insulating film 27 during the OFF state of the MOSFET and enhanced breakdown voltage to be realized. An n-type JFET region 22' between the first and second $p^+$-type regions 37, 38 may have an impurity concentration that is higher than an impurity concentration of the $n^-$-type drift region 22.

Further, the first and second $p^+$-type regions 37, 38 extend outward along the first direction X to a corner 13c of the recess 13 described hereinafter and at the corner 13c of the recess 13, underlie the $p^+$-type high-concentration region 51. Further, the second $p^+$-type region 38 is disposed further outward in the second direction Y than is the trench 26 that is outermost. The second $p^+$-type region 38 that is further outward in the second direction Y than is the trench 26 that is outermost, is disposed at a position that is closer to the $n^+$-type starting substrate 21 than is the p-type base region extended portion 23'; and the second $p^+$-type region 38 is in contact with the p-type base region extended portion 23'. Additionally, the second $p^+$-type region 38 extends outward along the second direction Y, to the corner 13c of the recess 13 and at the corner 13c of the recess 13, underlies the $p^+$-type high-concentration region 51.

An interlayer insulating film 29 is provided on the front surface 13a of the semiconductor substrate 10 overall and covers the gate electrode 28. A first contact hole 29a that penetrates the interlayer insulating film 29 in the depth direction Z is provided. The first contact hole 29a exposes the mesa region (i.e., the $n^+$-type source region 24 and the $p^+$-type contact region 25) in the active region 1. Each mesa region is exposed by a respective first contact hole 29a. The first contact holes 29a, for example, are dispersed at a predetermined interval along the first direction X and each exposes a respective $p^+$-type contact region 25. In each of the first contact holes 29a, the metal film 30 is provided on the front surface 13a of the semiconductor substrate 10.

The metal films 30 are in contact with the $n^+$-type source region 24 and the respective $p^+$-type contact regions 25, and form contacts that have voltage-current characteristics that exhibit an ohmic property. The metal films 30, for example, are nickel silicide (NiSi) films. The source electrode 31 is electrically connected with the $n^+$-type source region 24, the $p^+$-type contact regions 25, and the p-type base region 2, via the metal films 30. The source electrode 31 covers substantially an entire surface of the active region 1, at the front surface 13a of the semiconductor substrate 10. The source electrode 31 serves as a source pad. The source electrode 31 may extend on the interlayer insulating film 29 and terminate at the border region 3. The source electrode 31, for example, may be an aluminum-silicon (Al—Si) film.

Further, in the active region 1, a gate pad 32 is provided on the interlayer insulating film 29, for example, near the border between the active region 1 and the border region 3, and is separated from the source electrode 31. The gate pad 32, for example, has a substantially rectangular planar shape. The gate pad 32, for example, is formed by a same material as that of the source electrode 31. All of the gate electrodes 28 are electrically connected to the gate pad 32 via a gate runner 53 and a conductive layer 52 described hereinafter. A drain electrode (second electrode) 33 is provided at a rear surface of the semiconductor substrate 10 overall, spanning the active region 1 and the edge terminating region 2. The drain electrode 33 is in contact with the rear surface of the $n^+$-type starting substrate 21 that constitutes the $n^+$-type drain region, the drain electrode 33 forming a contact that has voltage-current characteristics that exhibit an ohmic property.

The edge terminating region 2 is a region that is between the border region 3 and an edge of the semiconductor substrate 10, and surrounds a periphery of the active region 1 in a substantially rectangular shape, sandwiching the border region 3 therebetween. The edge terminating region 2 has a function of mitigating electric field concentration at an end of the active region 1 and maintaining a predetermined breakdown voltage (withstand voltage). The breakdown voltage is a voltage limit at which no errant operation or breakdown of an element occurs and there is no excessive increase in leak current. The p-type silicon carbide epitaxial layer 12 is removed from the edge terminating region 2 entirely, whereby at the front surface 13a of the semiconductor substrate 10, the edge terminating region 2 is made lower than the active region 1 (recessed toward the n+-type starting substrate 21), thereby forming the recess 13. A front surface 13a' of the semiconductor substrate 10 is newly formed in the edge terminating region 2 by the recess 13.

At the front surface 13a' of the semiconductor substrate 10 in the edge terminating region 2, the n−-type silicon carbide epitaxial layer 11 is exposed. When the recess 13 is formed, the n−-type silicon carbide epitaxial layer 11 may be removed to a predetermined depth together with the p-type silicon carbide epitaxial layer 12. The step 13b of the recess 13, for example, is positioned in the border region 3. The step 13b of the recess 13 is a portion of the front surface of the semiconductor substrate 10, the portion that connects the front surface 13a (upper tier surface) of an inward portion of the semiconductor substrate 10 and the front surface 13a' (lower tier surface) of an outward portion of the semiconductor substrate 10. At the step 13b of the recess 13, the p+-type high-concentration region 51 described hereinafter is exposed. The front surface 13a' of the outward portion of the semiconductor substrate 10 may extend to the border region 3, the front surface 13a' being the lower tier surface of the recess 13.

In the edge terminating region 2, in the surface layer of the front surface 13a' of the semiconductor substrate 10, for example, a breakdown voltage structure is disposed such as a junction termination extension (JTE) structure 40 constituted by plural p-type regions (here, for example, two p-type regions assigned reference numerals 41, 42, respectively from an inward side) where the further outward the p-type regions are disposed, the lower is the impurity concentration thereof. The p−-type region 41 that is innermost in the JTE structure 40 surrounds a periphery of the active region 1, sandwiching the border region 3 therebetween. The p−−-type region 42 of the JTE structure 40 is adjacent to and disposed on an outer side of the p−-type region 41, and surrounds a periphery of the p−-type region 41. A depth from the front surface 13a' of the semiconductor substrate 10 in the edge terminating region 2 is deeper than the p−-type region 41 and the p−−-type region 42 and, for example, is deeper in the second p+-type region 38.

A depletion layer that spreads outward from an end of a pn junction surface between the second p+-type region 38 and the n−-type drift region 22 during the OFF state spreads in the p−-type region 41 and the p−−-type region 42, whereby the breakdown voltage is sustained by the edge terminating region 2. Further, in the edge terminating region 2, an n-type channel stopper region 43 is selectively provided in the surface layer at the front surface 13a' of the semiconductor substrate 10, the n-type channel stopper region 43 being provided further outward than the JTE structure 40 and separated from the JTE structure 40. The n-type channel stopper region 43 is exposed at a portion (side surface of the semiconductor substrate 10) of the semiconductor substrate 10. In the edge terminating region 2, the front surface 13a' of the semiconductor substrate 10 is covered by a field oxide film 44 that is provided between the semiconductor substrate 10 and the interlayer insulating film 29.

The border region 3 is constituted by the p+-type high-concentration region 51 provided in the surface layer at the front surface 13a of the semiconductor substrate 10, between the active region 1 and the edge terminating region 2. The p+-type high-concentration region 51, for example, is formed in a surface region of the p-type base region extended portion 23' by ion implantation of a p-type impurity such as aluminum. The p+-type high-concentration region 51 is disposed separated from the n+-type source region 24 of the active region 1 along the first direction X and is disposed separated from an outer side wall of the trench 26 that is outermost, of the side walls constituting the trench 26 that is outermost along the second direction Y. Along the second direction Y, between the p+-type high-concentration region 51 and the trench 26 that is outermost, the n+-type source region 24 and the p+-type contact region 25 are not provided.

Along the first direction X, a portion between the p+-type high-concentration region 51 and the n+-type source region 24 and along the second direction Y, a portion between the p+-type high-concentration region 51 and the trench 26 that is outermost, are portions of the p-type base region extended portion 23' that is constituted by the p-type silicon carbide epitaxial layer 12, and are exposed at the front surface 13a of the semiconductor substrate 10 along the border between the active region 1 and the border region 3 (portions without hatching in FIG. 3 (similarly in FIGS. 9, 11, 13, 15, and 17)). In other words, in a substantially linear shape extending along a pair of opposite sides of the active region 1 that has a substantially rectangular planar shape, or in a substantially rectangular shape surrounding a periphery of the active region 1 that has a substantially rectangular planar shape, the p-type base region extended portion 23' is exposed at the front surface 13a of the semiconductor substrate 10, along the border between the active region 1 and the border region 3.

In FIG. 3, while only the state of a corner of the semiconductor substrate 10 is depicted, along parallel opposite sides along the second direction Y of the border between the active region 1 and the border region 3, the p+-type high-concentration region 51 is disposed separated from the n+-type source region 24. Along parallel opposite sides along the first direction X of the border between the active region 1 and the border region 3, the p+-type high-concentration region 51 is disposed separated from the trench 26 that is outermost. As a result, along the first direction X, a portion of the p-type base region extended portion 23' between the p+-type high-concentration region 51 and the n+-type source region 24, or along the second direction Y, a portion between the p+-type high-concentration region 51 and the trench 26 that is outermost, or both portions may be constituted by the p-type silicon carbide epitaxial layer 12 in which no crystal defects are present.

Along the first direction X, a first distance X1 from the p+-type high-concentration region 51 to the n+-type source region 24, for example, is about 0.6 μm or more. Along the second direction Y, a second distance Y1 from the p+-type high-concentration region 51 to the trench 26 that is outermost, for example, is about 0.6 μm or more. Provided at least one of the conditions of the first and the second distances X1, Y1 is satisfied, effects of the present invention described hereinafter are obtained. When both conditions of the first and the second distances X1, Y1 are satisfied, the first and the second distances X1, Y1 are equal (X1=Y1). As viewed from the front surface 13a of the semiconductor substrate 10, a periphery of the active region 1 is surrounded by the p-type base region extended portion 23' that has a width of 0.6 μm or more, and a periphery of the p-type base region extended portion 23' is surrounded by the p+-type high-concentration region 51.

In this manner, the p-type base region extended portion 23' constituted by the p-type silicon carbide epitaxial layer 12 is disposed between the active region 1 and the p+-type high-concentration region 51. As a result, under high temperature conditions (for example, about 125 degrees C. or higher), even when the gate voltage Vg (the gate voltage Vg<0: negative gate bias) that is a negative bias with respect to the electric potential of the source electrode 31 is applied to the gate electrode 28 for a long period, the amount of variation ΔVg from the time of the initial state of the gate voltage Vg, corresponding to a predetermined magnitude of the drain current Id may be reduced. As a result, an interval during which characteristics of the gate threshold voltage Vth are unstable due to negative gate bias application under high-temperature conditions, i.e., an interval during which NBTI occurs may be reduced. Further, under high-temperature conditions, even when negative gate bias is applied to the gate electrode 28 for a long period, a magnitude of drain cutoff current (leak current) Idss may be made close to that at the time of the initial state.

The amount of variation ΔVg from the time of the initial state of the gate voltage Vg is a value (difference) obtained by subtracting from the gate voltage Vg at the initial state, the gate voltage Vg of a state in which negative gate bias is applied. During energization is when the gate voltage Vg (the gate voltage Vg≥0: positive gate voltage) that is positive bias with respect to the electric potential of the source electrode 31 is applied to the gate electrode 28, the gate voltage Vg is increased, and the gate voltage Vg becomes the gate threshold voltage Vth or greater. The drain current Id begins to flow after energization and increases accompanying increases of the gate voltage Vg. The initial state is a state in which no negative gate bias is applied to the gate electrode 28, i.e., a state in which a total application time of negative gate bias to the gate electrode 28 is 0 (zero) V.

Further, the p$^+$-type high-concentration region 51 is exposed at the front surface 13a of the semiconductor substrate 10 in the border region 3. Additionally, the p$^+$-type high-concentration region 51 is exposed from the step 13b and the corner 13c of the recess 13, spanning the front surface 13a' of the outward portion of the semiconductor substrate 10, the front surface 13a' being the lower tier surface of the recess 13. The corner 13c of the recess 13 is a border between the step 13b of the recess 13 and the front surface 13a' of the outward portion of the semiconductor substrate 10, the front surface 13a' being the lower tier surface of the recess 13. The p$^+$-type high-concentration region 51, at the corner 13c of the recess 13, is in contact with the n$^-$-type drift region 22 and the first and second p$^+$-type regions 37, 38 along the first direction X and the second p$^+$-type regions 38 along the second direction Y.

The p$^+$-type high-concentration region 51, along the first and the second directions X, Y, is in contact with the p$^-$-type region 41 that is innermost of the JTE structure 40. The p$^+$-type high-concentration region 51 may extend further outward than the first and second p$^+$-type regions 37, 38. In this case, the p$^+$-type high-concentration region 51 is in contact with the n$^-$-type drift region 22 between the p$^-$-type region 41 of the JTE structure 40 and the first and second p$^+$-type regions 37, 38. An entire surface of the p$^+$-type high-concentration region 51 is covered by an insulating film constituted by the gate insulating film 27, the interlayer insulating film 29, and the field oxide film 44. In other words, the p$^+$-type high-concentration region 51 is not in direct contact with the metal films 30. The p$^+$-type high-concentration region 51 is electrically connected with the source electrode 31, via the p-type base region extended portion 23' (i.e., the p-type base region 23).

Further, the p$^+$-type high-concentration region 51 has an impurity concentration that is higher than that of the p-type base region 23. The p$^+$-type high-concentration region 51 has a function of reducing resistance of the p-type base region 23. Reduction of the resistance of the p-type base region 23 enables prevention of increases of the electric potential of the p-type base region extended portion 23' (i.e., the p-type base region 23) near the border of the border region 3 and the edge terminating region 2 where electric field concentrates due to avalanche breakdown in the OFF state or when hole current mainly occurring at an end of the active region 1 is drawn to the source electrode 31. As a result, electric field applied to the gate insulating film 27 having a thin thickness may be mitigated, the life of the gate insulating film 27 may be extended, and insulation breakdown of the gate insulating film 27 may be prevented.

At the border region 3, the conductive layer 52 that contains poly-silicon (poly-Si) and the gate runner 53, for example, formed of a same material as the source electrode 31 are provided on the field oxide film 44 (refer to FIG. 2). In the conductive layer 52, at a non-depicted portion, all of the gate electrodes 28 are electrically connected. The conductive layer 52 is covered by the interlayer insulating film 29. The gate runner 53 is connected to the conductive layer 52, via a second contact hole 29b that penetrates the interlayer insulating film 29 in the depth direction. The conductive layer 52 and the gate runner 53 surround a periphery of the active region 1 in a substantially rectangular shape. The gate runner 53 is connected to the gate pad 32 (refer to FIG. 1).

While not particularly limited hereto, for example, when the MOSFET according to the first embodiment has a breakdown voltage of 1200V, dimensions and impurity concentrations of regions are assumed to have the following values. An impurity concentration of the n$^+$-type starting substrate 21, for example, is about $1\times10^{18}$/cm$^3$. A thickness t11 of the n$^-$-type silicon carbide epitaxial layer 11, for example, is 10 μm, An impurity concentration of the n$^-$-type silicon carbide epitaxial layer 11 (the n$^-$-type drift region 22), for example, is in a range from about $5\times10^{15}$/cm$^3$ to $2\times10^{16}$/cm$^3$. An impurity concentration of the n-type JFET region 22', for example, is about $1\times10^{17}$/cm$^3$.

A thickness t1 of the p$^+$-type region 37, for example, may be about 0.5 μm. The p$^+$-type region 37, for example, reaches a depth of about 2 μm from the front surface 13a of the semiconductor substrate 10. A thickness t2 of the second p$^+$-type region 38, for example, may be about 1 μm. The second p$^+$-type region 38, for example, reaches a depth of about 2 μm from the front surface 13a of the semiconductor substrate 10. Impurity concentrations the first and second p$^+$-type regions 37, 38, for example, are in a range from about $1\times10^{17}$/cm$^3$ to $1\times10^{19}$/cm$^3$ and, for example, may be about $1\times10^{18}$/cm$^3$.

A thickness t12 of the p-type silicon carbide epitaxial layer 12, for example, is about 1 μm. An impurity concentration of the p-type silicon carbide epitaxial layer 12 (the p-type base region 23), for example, is in a range from about $1\times10^{16}$/cm$^3$ to $3\times10^{18}$/cm$^3$ and, for example, may be about $1\times10^{17}$/cm$^3$. An impurity concentration of the n$^+$-type source region 24, for example, is about $1\times10^{21}$/cm$^3$. A thickness t3 of the p$^+$-type high-concentration region 51, for example, is about 0.5 μm. An impurity concentration of the p$^+$-type high-concentration region 51, for example, is in a range from about $5\times10^{18}$/cm$^3$ to $1\times10^{21}$/cm$^3$.

Operation of the silicon carbide semiconductor device according to the first embodiment will be described. In a state where voltage (voltage between the source and drain) that is positive with respect to the source electrode 31 is applied to the drain electrode 33, the gate voltage Vg that is less than the gate threshold voltage Vth is applied to the gate electrode 28. As a result, a pn junction between the p-type base region 23 and the n$^-$-type drift region 22 becomes reverse biased, whereby reverse breakdown voltage of the active region 1 is ensured and the drain current Id does not flow. In other words, the MOSFET maintains the OFF state. At this time, for example, the MOSFET may be turned off assuredly by applying negative gate bias to the gate electrode 28.

On the other hand, in a state where voltage between the source and drain is applied, when the gate voltage Vg that is the gate threshold voltage Vth or higher is applied to the gate electrode 28, an n-type inversion layer (channel) is formed at a portion of the p-type base region 23, the portion being along the trench 26 and between the $n^+$-type source region 24 and the $n^-$-type drift region 22. As a result, current flows along paths of the $n^+$-type source region 24 and surface inversion layers of the $n^+$-type starting substrate 21, the $n^-$-type drift region 22, and the p-type base region 23, whereby the MOSFET turns on. In this manner, a switching operation of the MOSFET may be performed by controlling the gate voltage Vg.

Figure 6:
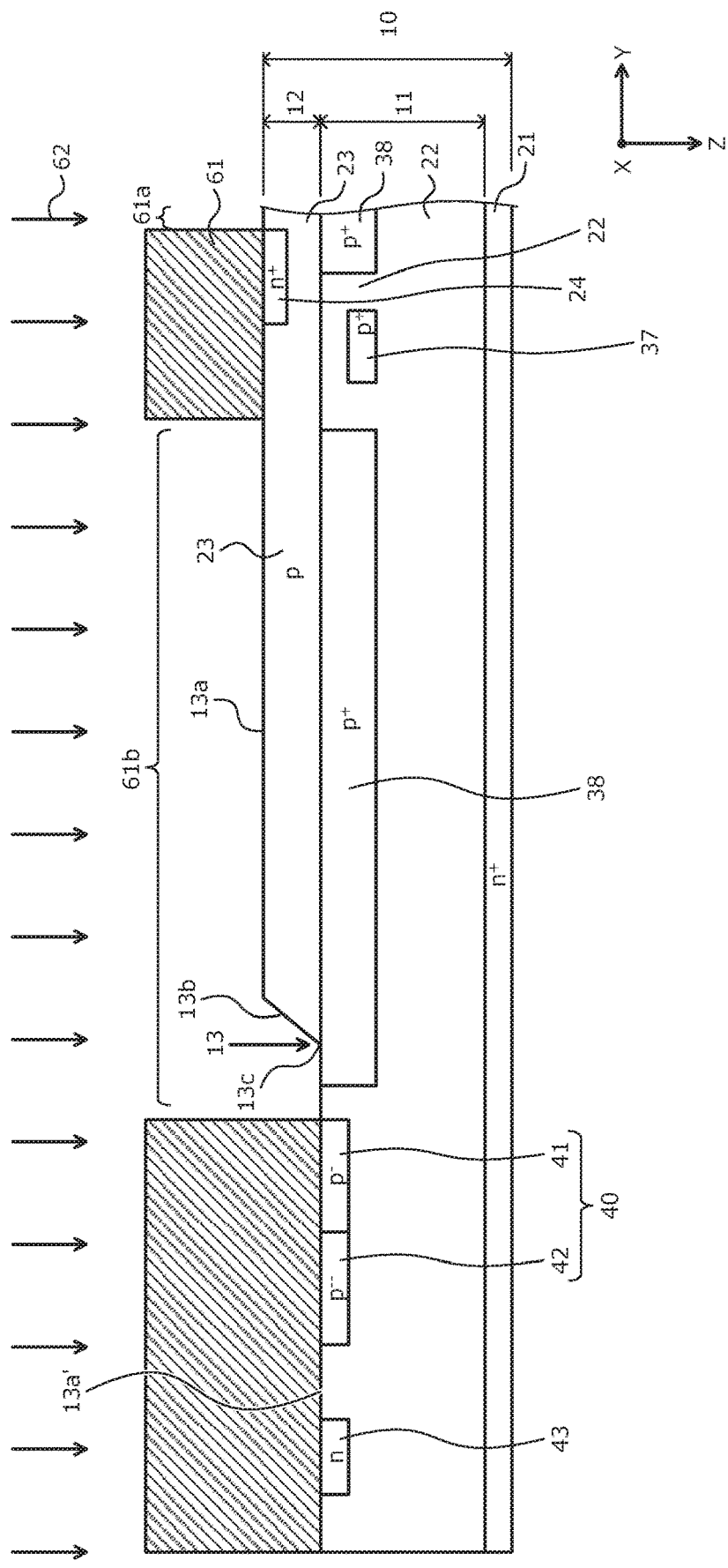
FIG. 6 is a cross-sectional view of the silicon carbide semiconductor device according to the first embodiment during manufacture.
Figure 7:
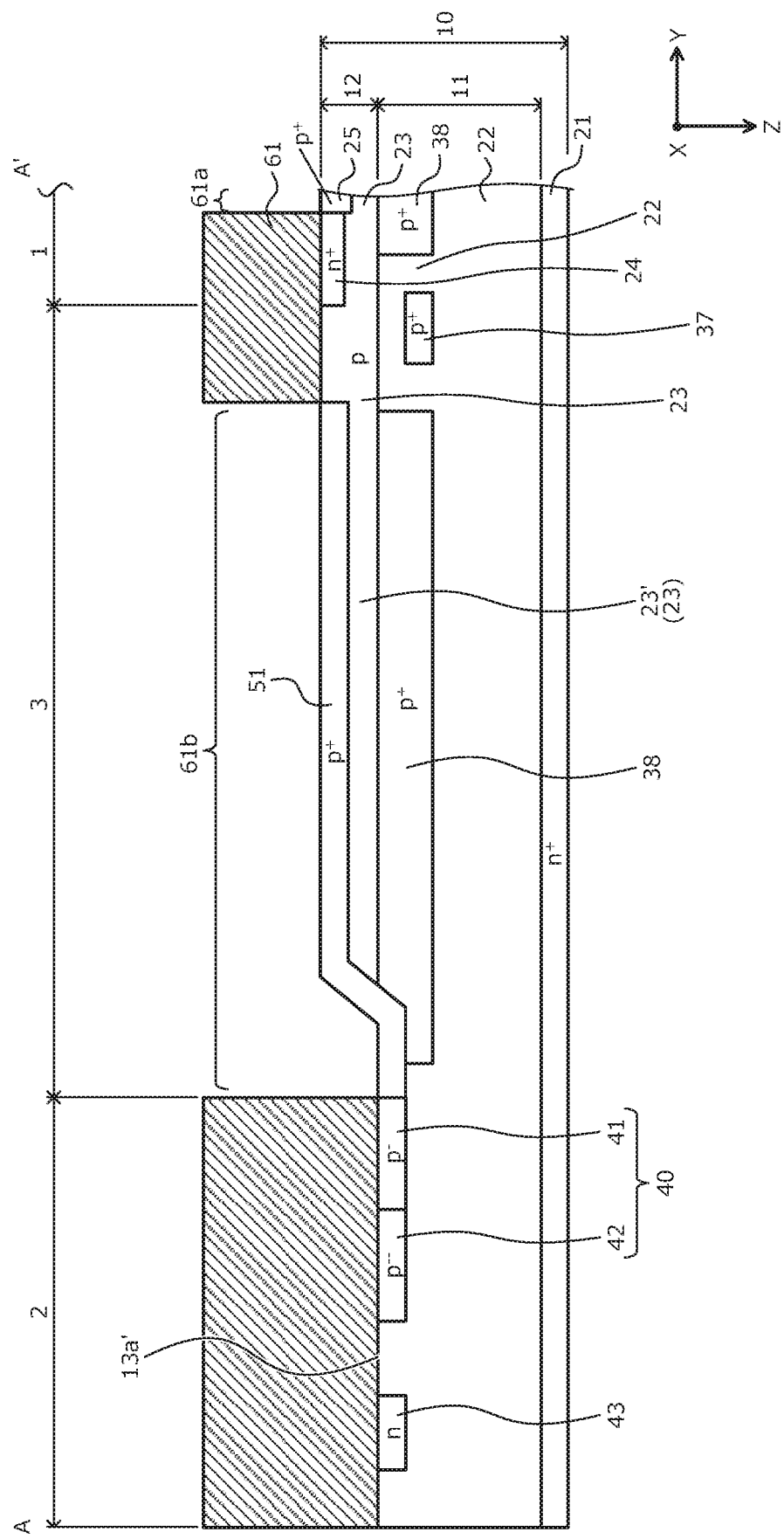
FIG. 7 is a cross-sectional view of the silicon carbide semiconductor device according to the first embodiment during manufacture.

A method of manufacturing the silicon carbide semiconductor device according to the first embodiment will be described. FIGS. 6 and 7 are cross-sectional views of the silicon carbide semiconductor device according to the first embodiment during manufacture. First, on a front surface of the $n^+$-type starting substrate 21, the $n^-$-type silicon carbide epitaxial layer 11 is formed by epitaxial growth. Next, by photolithography and ion implantation, the first and second $p^+$-type regions 37, 38 are selectively formed in the $n^-$-type silicon carbide epitaxial layer 11. Next, a thickness of the $n^-$-type silicon carbide epitaxial layer 11 is increased by epitaxial growth until the predetermined thickness t11 of the $n^-$-type silicon carbide epitaxial layer 11 is achieved.

Next, by photolithography and ion implantation, in a surface layer of the $n^-$-type silicon carbide epitaxial layer 11, a $p^+$-type region that constitutes the second $p^+$-type region 38 is formed, whereby the second $p^+$-type region 38 is increased in thickness until the predetermined thickness t2 is achieved. A portion of the $n^-$-type silicon carbide epitaxial layer 11 constitutes the $n^-$-type drift region 22, the portion excluding the $p^-$-type region 41, the $p^{--}$-type region 42 and the n-type channel stopper region 43 formed at a subsequent process and the first and second $p^+$-type regions 37, 38. Next, on a surface of the $n^-$-type silicon carbide epitaxial layer 11, the p-type silicon carbide epitaxial layer 12 is formed by epitaxial growth.

Next, the p-type silicon carbide epitaxial layer 12 is removed from the edge terminating region 2 entirely, thereby forming at the front surface 13a of the semiconductor substrate 10, the recess 13 where the edge terminating region 2 is lower than the active region 1. As a result, the $n^-$-type silicon carbide epitaxial layer 11 is exposed at the front surface 13a' of the semiconductor substrate 10 in the edge terminating region 2. Next, the $n^+$-type source region 24, the $p^+$-type contact region 25, the $p^+$-type high-concentration region 51, the JTE structure 40 (the $p^-$-type region 41, the $p^{--}$-type region 42), and the n-type channel stopper region 43 are selectively formed in the predetermined regions described above, respectively, by performing ion implantation using different oxide masks.

A formation sequence of the $n^+$-type source region 24, the $p^+$-type contact region 25, the $p^+$-type high-concentration region 51, the JTE structure 40, and the n-type channel stopper region 43 may be variously changed. Further, the $p^+$-type high-concentration region 51 may be formed concurrently with the $p^+$-type contact region 25. For example, after formation of the $n^+$-type source region 24, the JTE structure 40, and the n-type channel stopper region 43, when the $p^+$-type contact region 25 and the $p^+$-type high-concentration region 51 are formed, first, as depicted in FIG. 6, an oxide film 61 is deposited on the entire front surface (i.e., the front surface 13a, 13a' of the semiconductor substrate 10 and the step 13b of the recess 13) of the semiconductor substrate 10.

Next, by photolithography and etching, portions of the oxide film 61 corresponding to a formation region 61a of the $p^+$-type contact region 25 and a formation region 61b of the $p^+$-type high-concentration region 51 are removed. Next, the oxide film 61 that remains is used as a mask and, for example, ion implantation 62 of a p-type impurity such as aluminum is performed (FIG. 6). By the ion implantation 62, the $p^+$-type contact region 25 is formed in a predetermined region of the active region 1, and the $p^+$-type high-concentration region 51 is formed in a predetermined region of the border region 3 (FIG. 7). Conditions of the ion implantation 62, similarly to conventional ion implantation, may be a maximum acceleration energy of 350 keV and a total p-type impurity dose amount of $5.15 \times 10^{15}/cm^2$.

Next, heat treatment (activation annealing) for activating all ion implanted impurities, for example, is performed at a temperature of about 1700 degrees C. for about 10 minutes. Next, by a general method, a trench gate structure is formed by the trench 26, the gate insulating film 27, and the gate electrode 28. For example, after formation of the gate insulating film 27 by thermal oxidation, post oxidation anneal (POA) for improving interface characteristics between the gate insulating film 27 and a semiconductor portion may be performed. Thereafter, by a general method, the field oxide film 44, the interlayer insulating film 29, the metal film 30, the conductive layer 52, the source electrode 31, the gate pad 32, the gate runner 53, and the drain electrode 33 are formed, thereby completing the MOSFET depicted in FIGS. 1 to 5.

Next, as described, the p-type base region extended portion 23' constituted by the p-type silicon carbide epitaxial layer 12 is disposed between the active region 1 and the $p^+$-type high-concentration region 51, a reason for this is described. First, a mechanism of the shifting of the gain curve of the drain current Id (refer to FIG. 26) of the conventional silicon carbide semiconductor device (refer to FIGS. 21 to 25, hereinafter, conventional structure) significantly in a negative direction of the gate voltage Vg as compared to the initial state will be described. Shifting of the gain curve of the drain current Id is presumed to occur with the following five factors.

A first factor is that point defects occur in the p-type silicon carbide epitaxial layer 112 as a consequence of the ion implantation of a p-type impurity for forming the $p^+$-type high-concentration region 151 in the p-type silicon carbide epitaxial layer 112. A second factor is that the point defects in the p-type silicon carbide epitaxial layer 112 not only diffuse in a formation region of the $p^+$-type high-concentration region 151 but also diffuse further outward than the $p^+$-type high-concentration region 151, within a range of a few μm in a direction (i.e., radially, including first and second directions X, Y) parallel to the front surface of the semiconductor substrate 10.

A third factor is that the point defects in the p-type silicon carbide epitaxial layer 112 become hole traps in the gate insulating film 127 as a consequence of thermal oxidation (including POA) for forming the gate insulating film 127. A fourth factor is that in the gate electrode 128 of the MOSFET fabricated by processes including these factors, negative gate bias (for example, the gate voltage Vg=−5V) is applied under conditions such as a high temperature (for example, about 125 degrees C. or higher) of the semiconductor substrate 110, whereby holes accumulate at an interface between the p-type base region 123 and the gate insulating film 127.

A fifth factor is that some of the holes accumulated at the interface of the p-type base region 123 and the gate insulating film 127 tunnel and are captured by hole traps in the gate insulating film 127. As a result, as compared to the initial state, the gain curve of the drain current Id is greatly shifted in a negative direction of the gate voltage Vg. These five factors are remarkably apparent near sites electrically connected with the gate electrode 128 and the gate runner 153 that applies the gate voltage Vg to the gate electrode 128, i.e., near an outer periphery of the n⁺-type source region 124.

The five factors are remarkably apparent near the outer periphery of the n⁺-type source region 124, whereby the gain curve of the drain current Id is shifted only in a region where the drain current Id rises. Thus, with respect to the third factor, as in the present invention, the p⁺-type high-concentration region 51 is sufficiently separated from the n⁺-type source region 24 in terms of diffusion lengths of the point defects related to the second factor so that the point defects do not diffuse in the gate insulating film 27, and the p-type silicon carbide epitaxial layer 12 in which no defects are present is disposed between the active region 1 and the p⁺-type high-concentration region 51.

Figure 8:
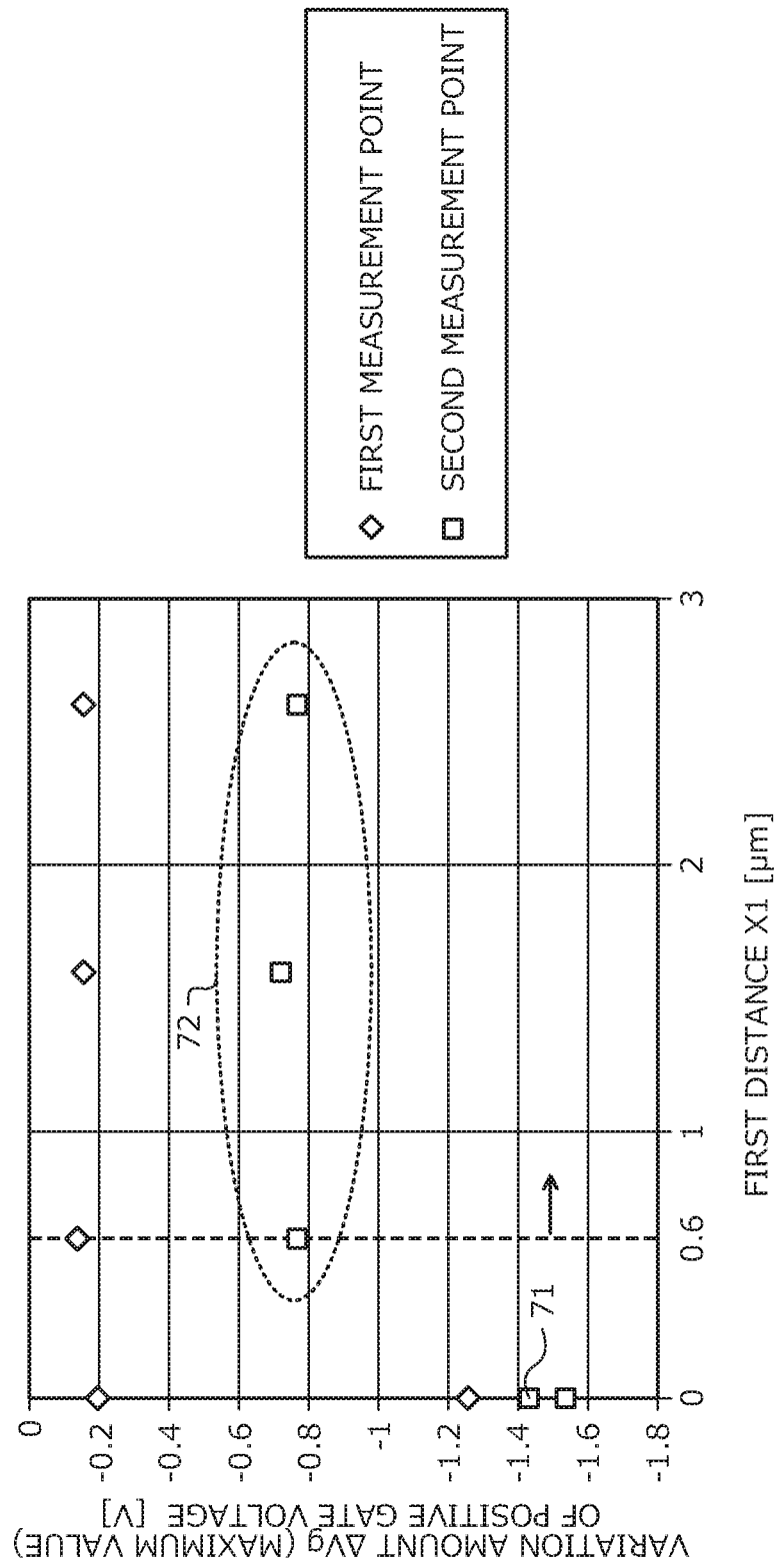
FIG. 8 is a characteristics diagram depicting results of verification of the first distance of a first example.

The first and the second distances X1, Y1 of the silicon carbide semiconductor device according to the first embodiment were verified. FIG. 8 is a characteristics diagram depicting results of verification of the first distance of a first example. In FIG. 8, a horizontal axis indicates the first distance X1 from the p⁺-type high-concentration region 51 to the n⁺-type source region 24 along the first direction X, and a vertical axis indicates maximum values of the amount of variation ΔVg of positive gate voltage generated during a predetermined period of observation of temporal changes of the positive gate voltage. First, n-channel type MOSFETs having a trench gate structure with the described structure of the silicon carbide semiconductor device according to the first embodiment were fabricated (hereinafter, first example). In samples of the first example, the first distance X1 differed respectively. An aluminum dose amount of a p⁺-type high-concentration region 51' was set to be 5.15×$10^{15}$/cm².

The gate voltage Vg (negative gate bias) of −5V was applied to the gate electrode 28 of each of the samples of the first example for a predetermined application period under a high-temperature atmosphere of 200 degrees C. in a state where the source electrode 31 and the drain electrode 33 were grounded. Further, each time the negative gate bias was applied to the gate electrode 28 for a certain application period, positive gate voltage was applied to the gate electrode 28 of each sample under a room temperature atmosphere, each sample was energized and the positive gate voltage was measured, whereby temporal changes from the time of the initial state of the positive gate voltage was observed for 1000 hours. The application period of the negative gate bias applied to the gate electrode 28 was incrementally increased by a predetermined period until 1000 hours was reach from 0 hours (the initial state).

Temporal changes from the time of the initial state of the positive gate voltage were observed at the first measurement point (corresponds to reference numeral 171 in FIG. 26) when the magnitude of the drain current Id is the magnitude Id1/I0 (=$10^{-3}$) that is 1/1000 of the rated current and at the second measurement point (corresponds to reference numeral 172 in FIG. 26) when the magnitude of the drain current Id is the magnitude Id2/I0 (=$10^{-9}$) that is 1/1,000,000 of the magnitude of the drain current Id1 at the first measurement point. Further, FIG. 8 depicts results of comparison of maximum values of the amount of variation ΔVg of the positive gate voltage from the time of the initial state thereof, corresponding to the magnitude of the drain current Id at the first and the second measurement points. In FIG. 8, a sample in which the first distance X1 was 0.0 μm corresponds to the conventional structure (refer to FIGS. 21 to 25) in which the p⁺-type high-concentration region 151 and the n⁺-type source region 124 are in contact with each other.

From the results depicted in FIG. 8, the amount of variation ΔVg from the time of the initial state of the positive gate voltage, corresponding to the magnitude of the drain current Id at each of the first and the second measurement points, was confirmed to be reduced to a greater extent than by the conventional structure as a consequence of setting the first distance X1 from the p⁺-type high-concentration region 51 to the n⁺-type source region 24 along the first direction X to be 0.6 μm or more. Reduction of the amount of variation ΔVg from the time of the initial state of the positive gate voltage is reduction of an absolute value of the amount of variation ΔVg from the time of the initial state of the positive gate voltage. In particular, setting the first distance X1 to be 0.6 μm or more, for example, even at the second measurement point where the positive gate voltage is close to the gate threshold voltage Vth as compared to the first measurement point, the amount of variation ΔVg from the time of the initial state of the positive gate voltage, corresponding to the magnitude of the drain current Id may be reduced from −1.45V (sample of data point indicated by reference numeral 71) of the conventional structure to about −0.8V (samples of data points surrounded by circle indicated by reference numeral 72).

Although not depicted, along the second direction Y, even when the second distance Y1 from the p⁺-type high-concentration region 51 to the trench 26 that is outermost is set to be 0.6 μm or more, results similar to the results depicted in FIG. 8 are obtained.

As described above, according to the first embodiment, the p⁺-type high-concentration region constituting the border region between the active region and the edge terminating region is disposed separated from the n⁺-type source region along the first direction, or is disposed separated from the trench that is outermost along the second direction, or is disposed separated from both. Along the first direction, a portion between the p⁺-type high-concentration region and the n⁺-type source region, or along the second direction, a portion between the p⁺-type high-concentration region and the outermost trench, or both portions is/are a portion(s) of the p-type silicon carbide epitaxial layer exposed at the front surface of the semiconductor substrate. As a result, a portion of the p-type base region extended portion, the portion adjacent to the gate insulating film, is the p-type silicon carbide epitaxial layer in which no crystal defects are present. Therefore, during thermal oxidation of the gate insulating film, generation of hole traps that cause crystal defects in the gate insulating film may be suppressed.

In this manner, the generation of hole traps in the gate insulating film is suppressed, enabling an accumulation of holes at the interface between the p-type base region and the gate insulating film to be suppressed when negative gate bias is applied to the gate electrode under high-temperature conditions. As a result, under high-temperature conditions, even when negative gate bias is applied to the gate electrode to maintain the OFF state, the amount of variation from the time of the initial state of the positive gate voltage, corresponding to a predetermined magnitude of the drain current may be reduced. Further, when gate voltage of 0V or less is applied to the gate electrode and the OFF state is maintained, the magnitude of the drain cutoff current may be made close to that at the time of the initial state. Therefore, as compared to the initial state, the gain curve of the drain current may be suppressed from being shifted in a negative direction of the gate voltage, and current controllability by gate voltage control may be enhanced.

Figure 9:
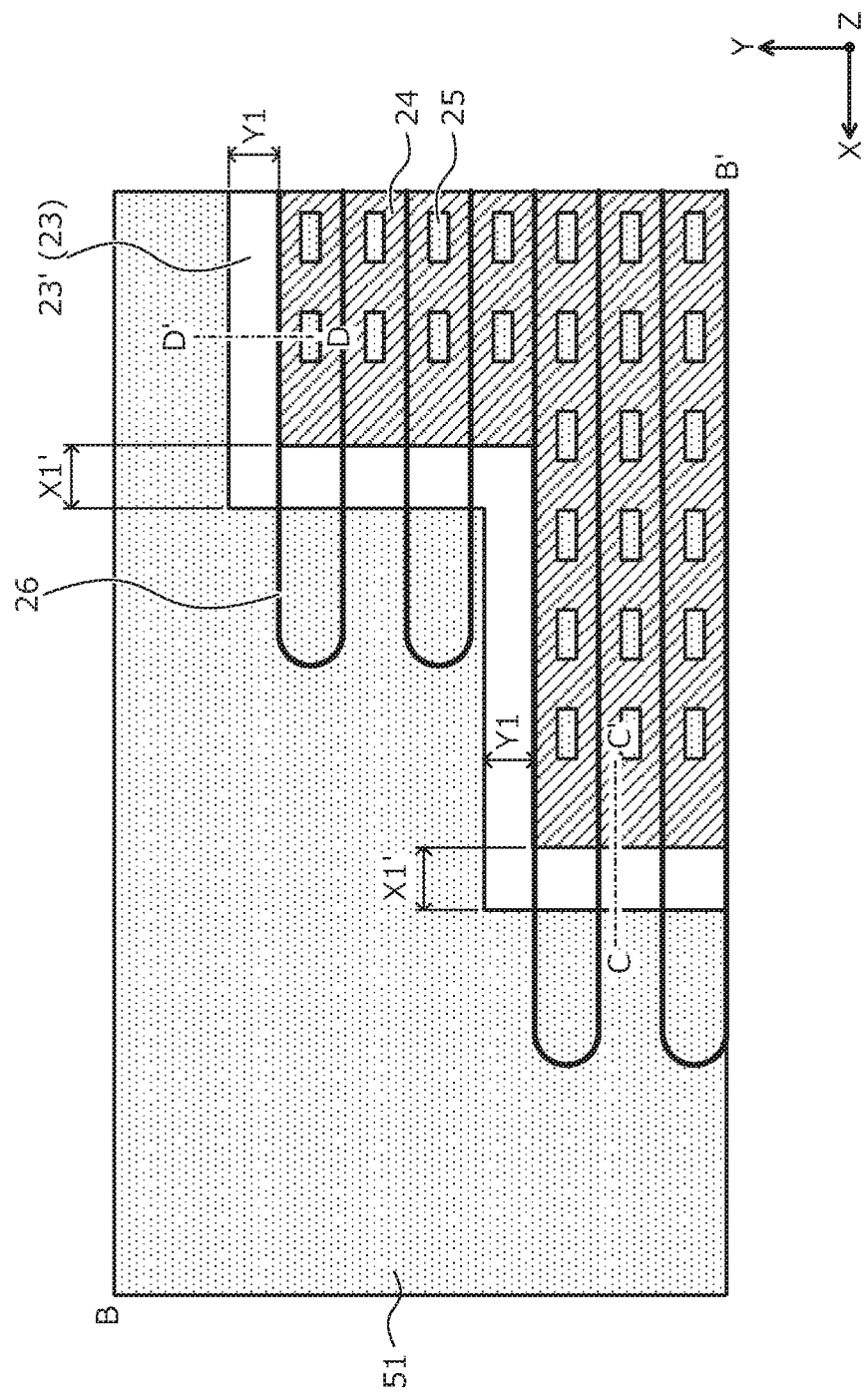
FIG. 9 is a plan view of a layout of a portion of the silicon carbide semiconductor device according to a second embodiment as viewed from the front surface of the semiconductor substrate.

A structure of the silicon carbide semiconductor device according to a second embodiment will be described. FIG. 9 is a plan view of a layout of a portion of the silicon carbide semiconductor device according to the second embodiment as viewed from the front surface of the semiconductor substrate. In FIG. 9, a state of a region near the border between the active region 1 and the border region 3, near a corner of the semiconductor substrate 10 is depicted, the region being surrounded by a rectangular frame formed by vertices B, B' that are opposing vertices depicted in FIG. 1. Positions of the vertex B and the vertex B' with respect to the semiconductor substrate 10 are similar to those in the first embodiment. A cross-sectional view along cutting line C-C' in FIG. 9 is similar to that depicted in FIG. 4, where reference numeral X1 is replaced with X1'. A cross-sectional view along cutting line D-D' in FIG. 9 is similar to that depicted in FIG. 5.

The silicon carbide semiconductor device according to the second embodiment differs from the silicon carbide semiconductor device according to the first embodiment on the following two points. A first difference is that a first distance X1' along the first direction X from the $p^+$-type high-concentration region 51 to the $n^+$-type source region 24 is greater than the second distance Y1 along the second direction Y from the $p^+$-type high-concentration region 51 to the trench 26 that is outermost (X1'>Y1). A second difference is that the $p^+$-type high-concentration region 51 is disposed to also satisfy conditions of the first and the second distances X1', Y1. The first distance X1', for example, is set to be about 9.35 μm or more while the second distance Y1, for example, is set to be about 0.6 μm or more.

Figure 10:
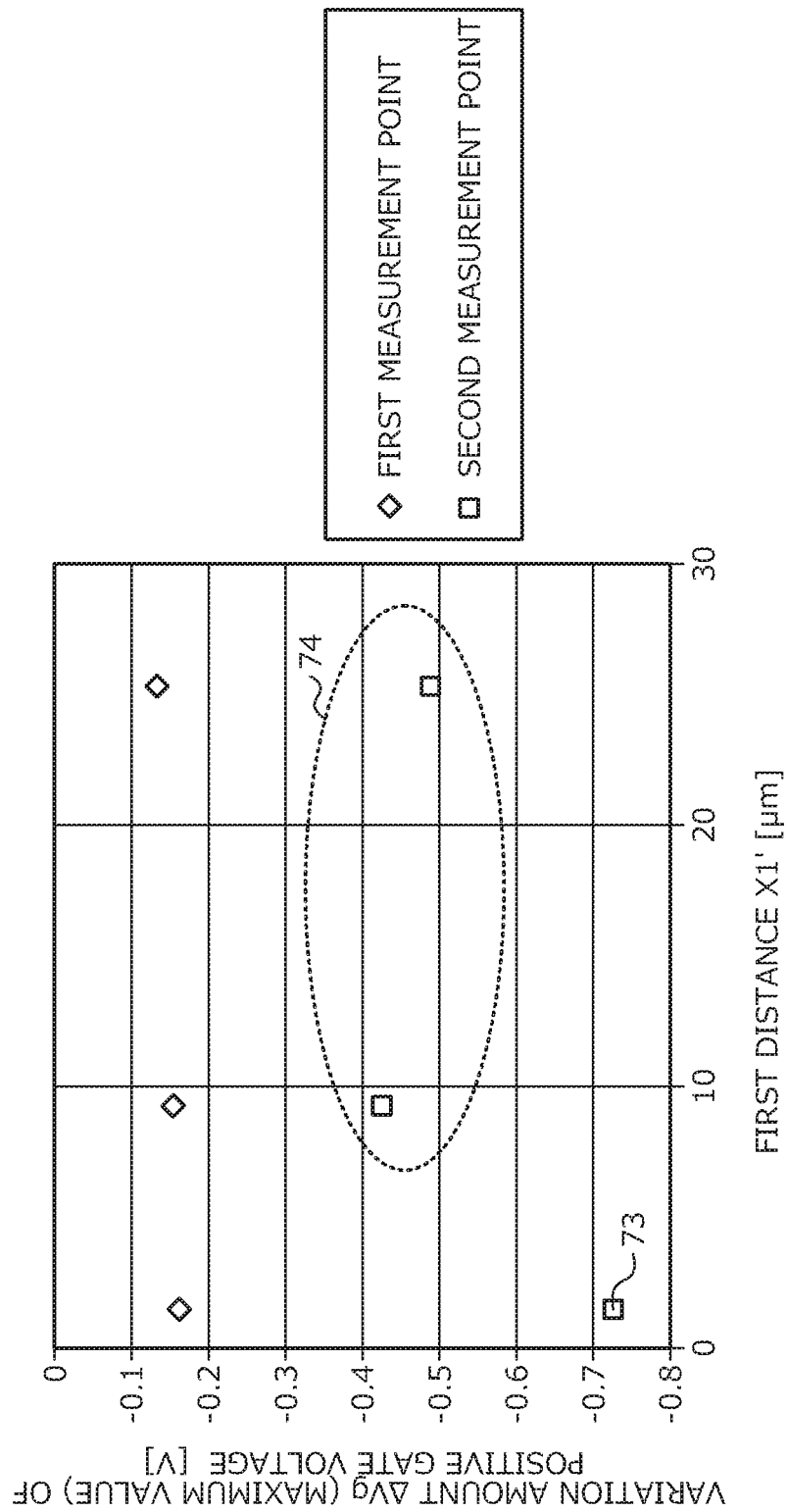
FIG. 10 is a characteristics diagram depicting results of verification of a first distance of a second example.

The first and the second distances X1', Y1 of the silicon carbide semiconductor device according to the second embodiment were verified. FIG. 10 is a characteristics diagram depicting results of verification of the first distance of a second example. In FIG. 10, a horizontal axis is the first distance X1' along the first direction X from the $p^+$-type high-concentration region 51 to the $n^+$-type source region 24 and a vertical axis is maximum value of the amount of variation ΔVg of positive gate voltage occurring in a predetermined period during which temporal changes of the positive gate voltage were observed. First, plural n-channel type MOSFETs having a trench gate structure that has the described structure of the silicon carbide semiconductor device according to the second embodiment were fabricated (hereinafter, second example).

The first distance X1' in samples of the second example differed respectively. The second distance Y1 in all of the samples of the second example was 1.6 μm. Rated current of the samples of the second example was similar to that of the first example. A dose amount of the $p^+$-type high-concentration region 51 was similar to that in the first example. Further, with respect to the samples of the second example, similarly to the first example, temporal changes from the time of the initial state of the positive gate voltage were observed at the first and the second measurement points, and results of comparison of maximum values of the amount of variation ΔVg from the time of the initial state of the positive gate voltage, corresponding to a predetermined magnitude of the drain current Id are depicted in FIG. 10.

From the results depicted in FIG. 10, in the second example, it was confirmed that in a sample in which the second distance Y1 was 1.6 μm and the first distance X1' was 9.35 μm or more, even at the second measurement point where the positive gate voltage is close to the gate threshold voltage Vth as compared to the first measurement point, the amount of variation ΔVg from the time of the initial state of the positive gate voltage, corresponding to the magnitude of the drain current Id for the second measurement point could be reduced from −0.75V (sample of data point indicated by reference numeral 73) to about −0.4V (sample of data point surround by circle indicated by reference numeral 74).

As described, when the second distance Y1 is 0.6 μm or more, a reduction effect for the amount of variation ΔVg from the time of the initial state of the positive gate voltage, corresponding to a predetermined magnitude of the drain current Id is obtained (refer to FIG. 9). Therefore, in the second example, when the first distance X1' is 9.35 μm or more, and the second distance Y1 is 0.6 μm or more, it was found that similarly to the results depicted in FIG. 10, the amount of variation ΔVg from the time of the initial state of the positive gate voltage, corresponding to the magnitude of the drain current Id for the second measurement point, could be reduced to about −0.4V.

As described above, according to the second embodiment, even when the first distance is wider than the second distance, effects similar to those of the first embodiment may be obtained.

Figure 11:
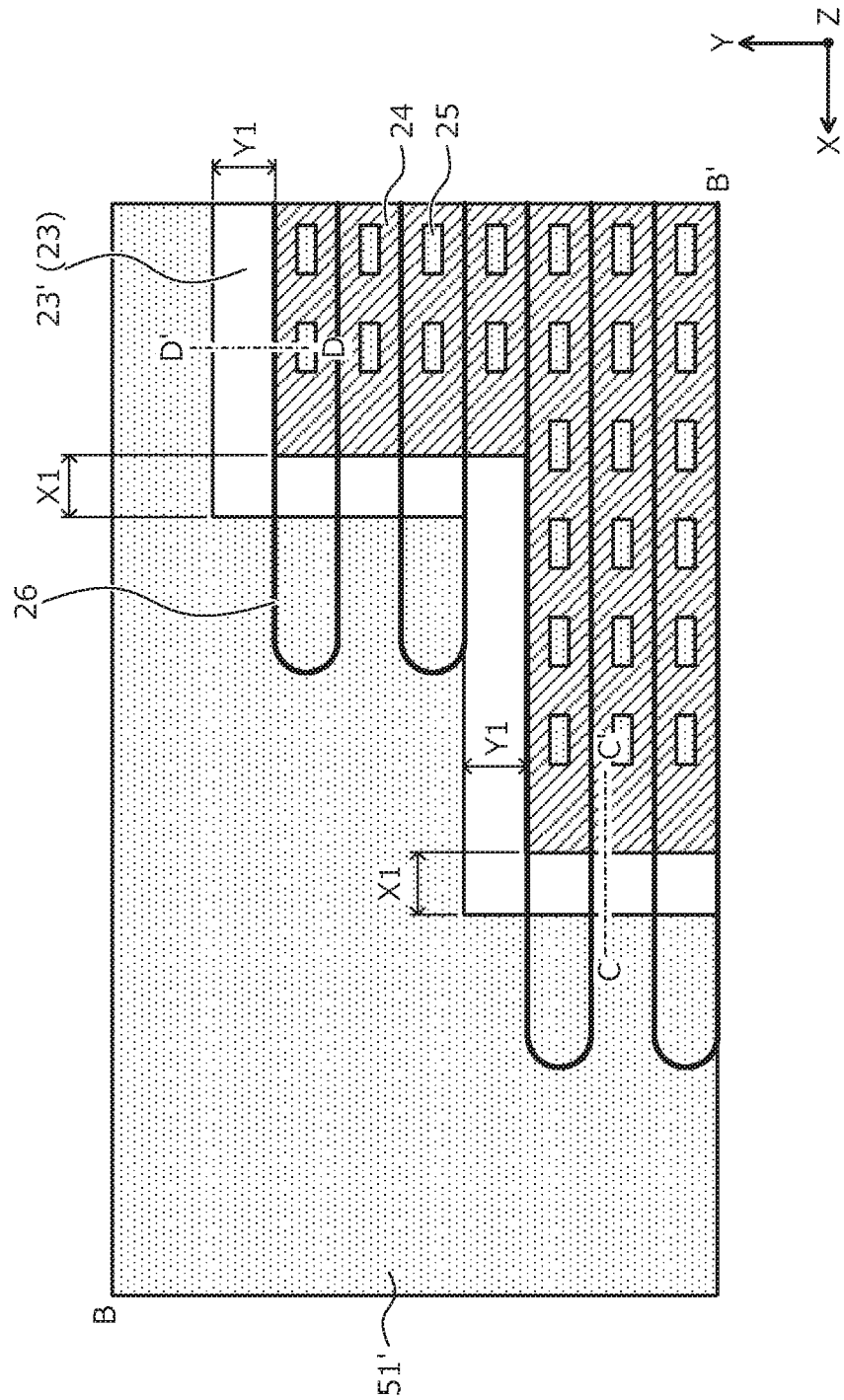
FIG. 11 is a plan view of a portion of a layout of the silicon carbide semiconductor device according to a third embodiment as viewed from the front surface of the semiconductor substrate.

A structure of the silicon carbide semiconductor device according to a third embodiment will be described. FIG. 11 is a plan view of a portion of a layout of the silicon carbide semiconductor device according to the third embodiment as viewed from the front surface of the semiconductor substrate. In FIG. 11, a state of a region near the border between the active region 1 and the border region 3, near a corner of the semiconductor substrate 10 is depicted, the region being surrounded by a rectangular frame formed by the vertices B, B' that are opposing vertices depicted in FIG. 1. Positions of the vertex B and the vertex B' with respect to the semiconductor substrate 10 are similar to those in the first embodiment. Cross-sectional views along cutting line C-C' and cutting line D-D' in FIG. 11 are respectively similar to those depicted in FIGS. 4 and 5, where reference numeral 51 is replaced with 51'.

The silicon carbide semiconductor device according to the third embodiment differs from the silicon carbide semiconductor device according to the first embodiment in that a dose amount of a $p^+$-type high-concentration region 51' that constitutes the border region 3 is reduced. When the first distance X1 from the $p^+$-type high-concentration region 51' to the $n^+$-type source region 24 is, for example, 0.6 μm or more, the dose amount of the $p^+$-type high-concentration region 51', for example, is about $6.4 \times 10^{14}/cm^2$ or less with aluminum as the dopant.

When the dose amount of the $p^+$-type high-concentration region 51' is, for example, about $3.4 \times 10^{14}/cm^2$ or less with aluminum as the dopant, the V-type high-concentration region 51' may be in contact with the $n^+$-type source region 24, similarly to the conventional structure (refer to FIGS. 21 to 25).

Figure 12:
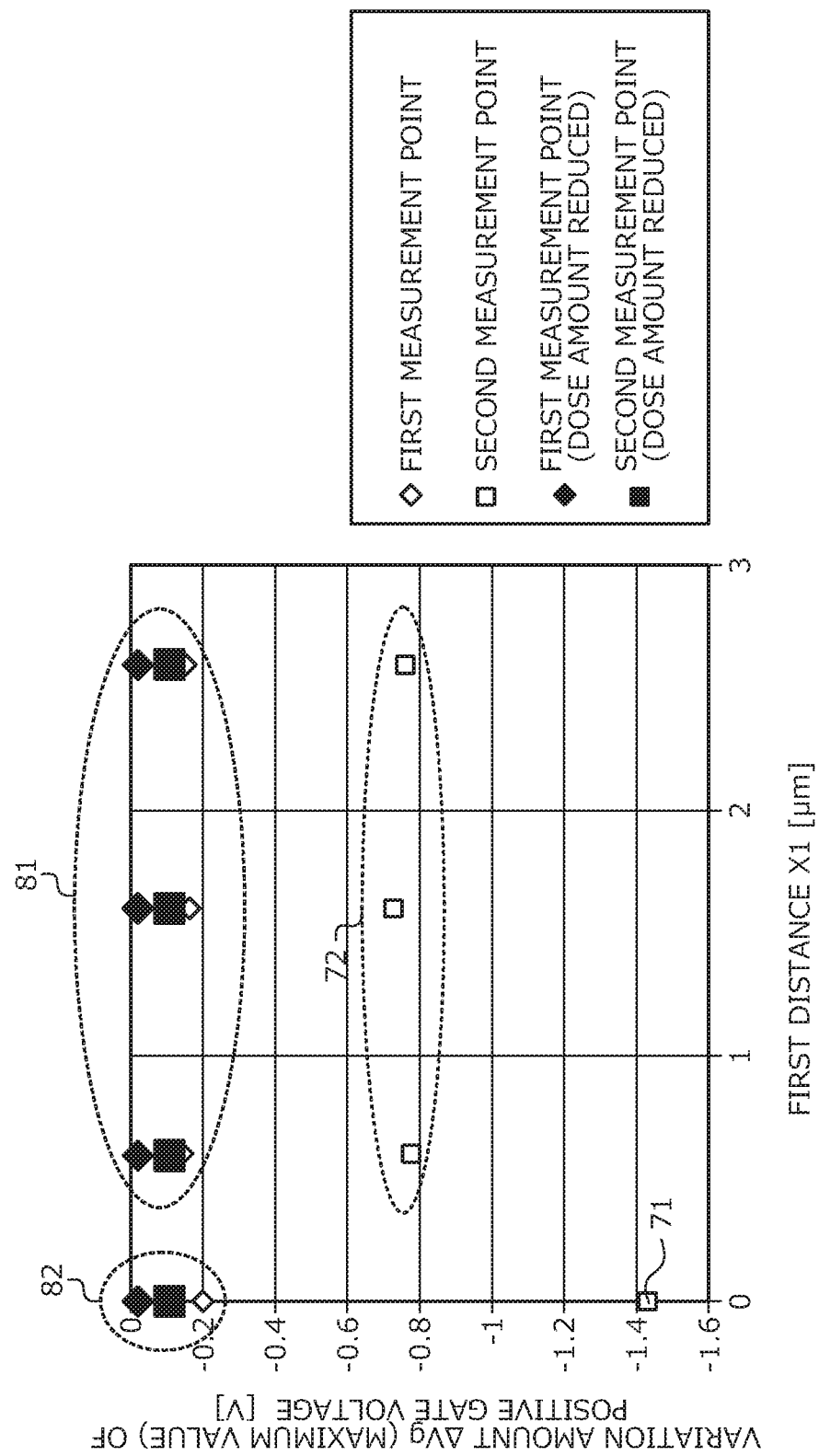
FIG. 12 is a characteristics diagram depicting results regarding a dose amount of a p$^+$-type high-concentration region in a third example.

The dose amount of the $p^+$-type high-concentration region 51' of the silicon carbide semiconductor device according to the third embodiment was verified. FIG. 12 is a characteristics diagram depicting results regarding the dose amount of the $p^+$-type high-concentration region in a third example. In FIG. 12, a horizontal axis is the first distance X1 along the first direction X from the p$^+$-type high-concentration region 51' to the n$^+$-type source region 24 and a vertical axis is maximum value of the amount of variation ΔVg of positive gate voltage occurring in a predetermined period during which temporal changes of the positive gate voltage were observed. First, plural n-channel type MOSFETs having a trench gate structure that has the described structure of the silicon carbide semiconductor device according to the third embodiment were fabricated (hereinafter, third example).

In first samples 81 of the third example, similarly to the first example, the first distance X1 was 0.6 μm or greater and differed respectively. From the mechanism of shifting of the gain curve of the drain current Id described above, shifting of the gain curve of the drain current Id is assumed to also be dependent on point defect density. Thus, an aluminum dose amount of the p$^+$-type high-concentration region 51' of the first samples 81 of the third example was set to be ⅛ (=6.4×10$^{14}$/cm$^2$) of the aluminum dose amount (=5.15× 10$^{15}$/cm$^2$) of the p$^+$-type high-concentration region 51 of the first example. A rated current of the first samples 81 of the third example was similar to that in the first example.

Further, a sample with a structure in which the p$^+$-type high-concentration region 51' and the n$^+$-type source region 24 are in contact with each other (i.e., the first distance X1=0 μm), and in which the aluminum dose amount of the p$^+$-type high-concentration region 51' was set to be 1/15 (=3.4×10$^{14}$/cm$^2$) of the aluminum dose amount of the p$^+$-type high-concentration region 51 of the first example was regarded as a second sample 82 of the third example. Other than the first distance X1 and the dose amount of the p$^+$-type high-concentration region 51, configuration of the second sample 82 of the third example was similar to that of the first samples 81 of the third example.

With respect to the first and second samples 81, 82 of the third example, similarly to the first example, temporal changes from the time of the initial state of the positive gate voltage were observed at the first and the second measurement points, respectively and comparison results of maximum values of the amount of variation ΔVg of the positive gate voltage from the time of the initial state thereof, corresponding to the magnitude of the drain current Id at the first and the second measurement points are depicted in FIG. 12. In FIG. 12, results (refer to FIG. 8) of the first example are indicated as "first and second measurement points" while results of the first and second samples 81, 82 of the third example are indicated as "first and second measurement points (dose amount reduced)".

From the results depicted in FIG. 12, in the conventional structure, the amount of variation ΔVg from the time of the initial state of the positive gate voltage, corresponding to the magnitude of the drain current Id for the second measurement point, was −1.45V (data point 71). In contrast, it was confirmed that also in the second sample 82 of the third example in which the first distance X1 was set to be 0 μm, the amount of variation ΔVg from the time of the initial state of the positive gate voltage, corresponding to the magnitude of the drain current Id for the second measurement point, was reduced to −0.095V. Further, in the first samples 81 of the third example in which the first distance X1 was set to be 0.6 μm or more, by setting the dose amount of the p$^+$-type high-concentration region 51' to be ⅛ of the dose amount of the p$^+$-type high-concentration region 51 of the first example, it was confirmed that the amount of variation ΔVg from the time of the initial state of the positive gate voltage, corresponding to the magnitude of the drain current Id for the second measurement point, could be reduced to −0.090V to 0.098V.

As described, according to the third embodiment, even when the dose amount of the p$^+$-type high-concentration region is reduced, effects similar to those of the first and second embodiments may be obtained.

Figure 13:
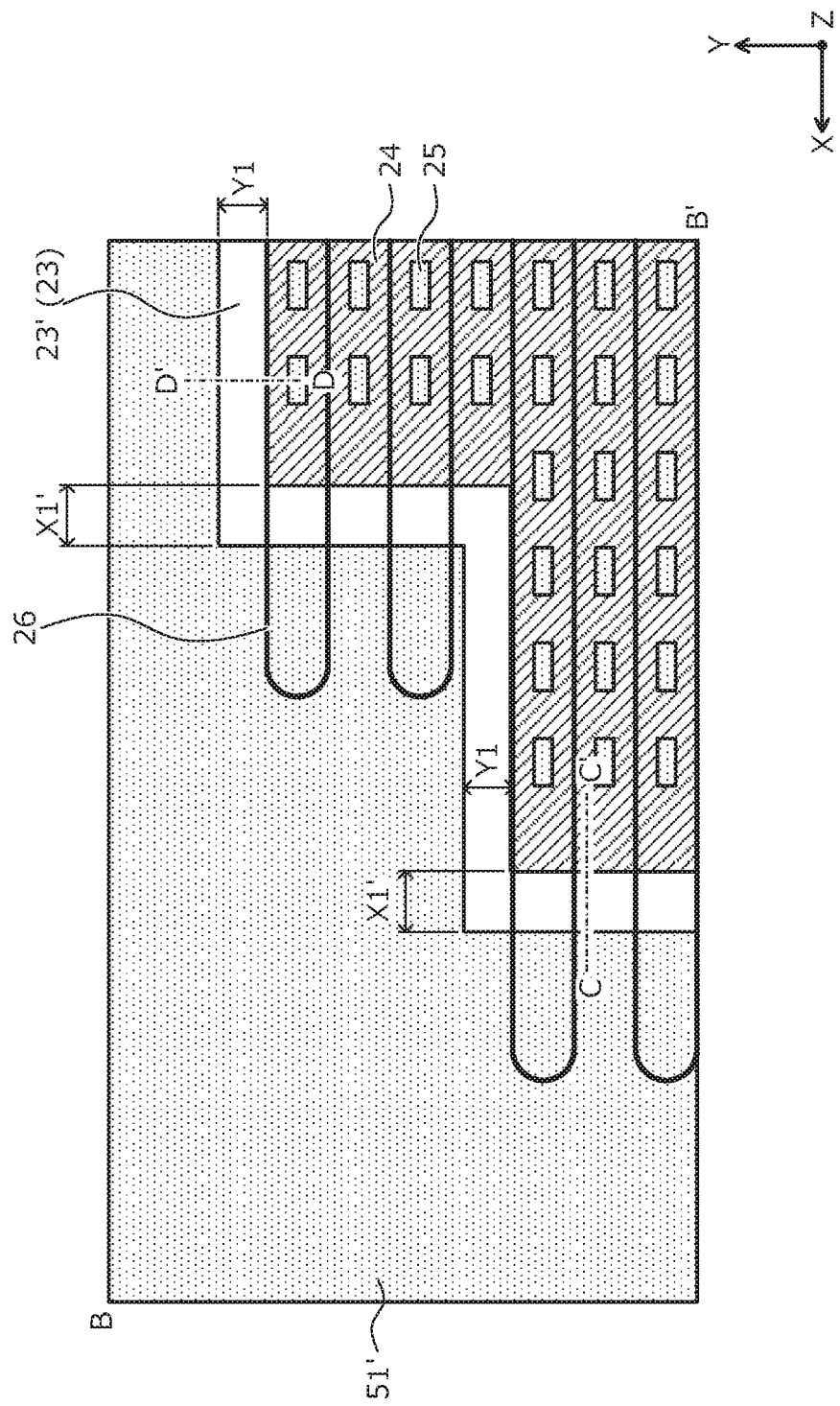
FIG. 13 is a plan view of a layout of a portion of the silicon carbide semiconductor device according to a fourth embodiment as viewed from the front surface of the semiconductor substrate.

A structure of the silicon carbide semiconductor device according to a fourth embodiment will be described. FIG. 13 is a plan view of a layout of a portion of the silicon carbide semiconductor device according to the fourth embodiment as viewed from the front surface of the semiconductor substrate. In FIG. 13, a state of a region near the border between the active region 1 and the border region 3, near a corner of the semiconductor substrate 10 is depicted, the region being surrounded by a rectangular frame formed by the vertices B, B' that are opposing vertices depicted in FIG. 1. Positions of the vertex B and the vertex B' with respect to the semiconductor substrate 10 are similar to those in the first embodiment. A cross-sectional view along cutting line C-C' in FIG. 13 is similar to that depicted in FIG. 4, where reference characters 51, X1 are replaced with 51', X1', respectively. A cross-sectional view along cutting line D-D' in FIG. 13 is similar to that depicted in FIG. 5, where reference numeral 51 is replaced with 51'.

The silicon carbide semiconductor device according to the fourth embodiment differs from the silicon carbide semiconductor device according to the second embodiment in that the dose amount of the p$^+$-type high-concentration region 51' that constitutes the border region 3 is reduced as compared to the second embodiment. In other words, the silicon carbide semiconductor device according to the fourth embodiment has the configuration of the silicon carbide semiconductor device according to the second embodiment to which the condition of the p$^+$-type high-concentration region 51' of the third embodiment is applied. When the first distance X1', for example, is set to be about 9.35 μm or more and the second distance Y1, for example, is set to be about 0.6 μm or more, the dose amount of the p$^+$-type high-concentration region 51', for example, is about 1.03×10$^{15}$/cm$^2$ or less with aluminum being the dopant.

Figure 14:
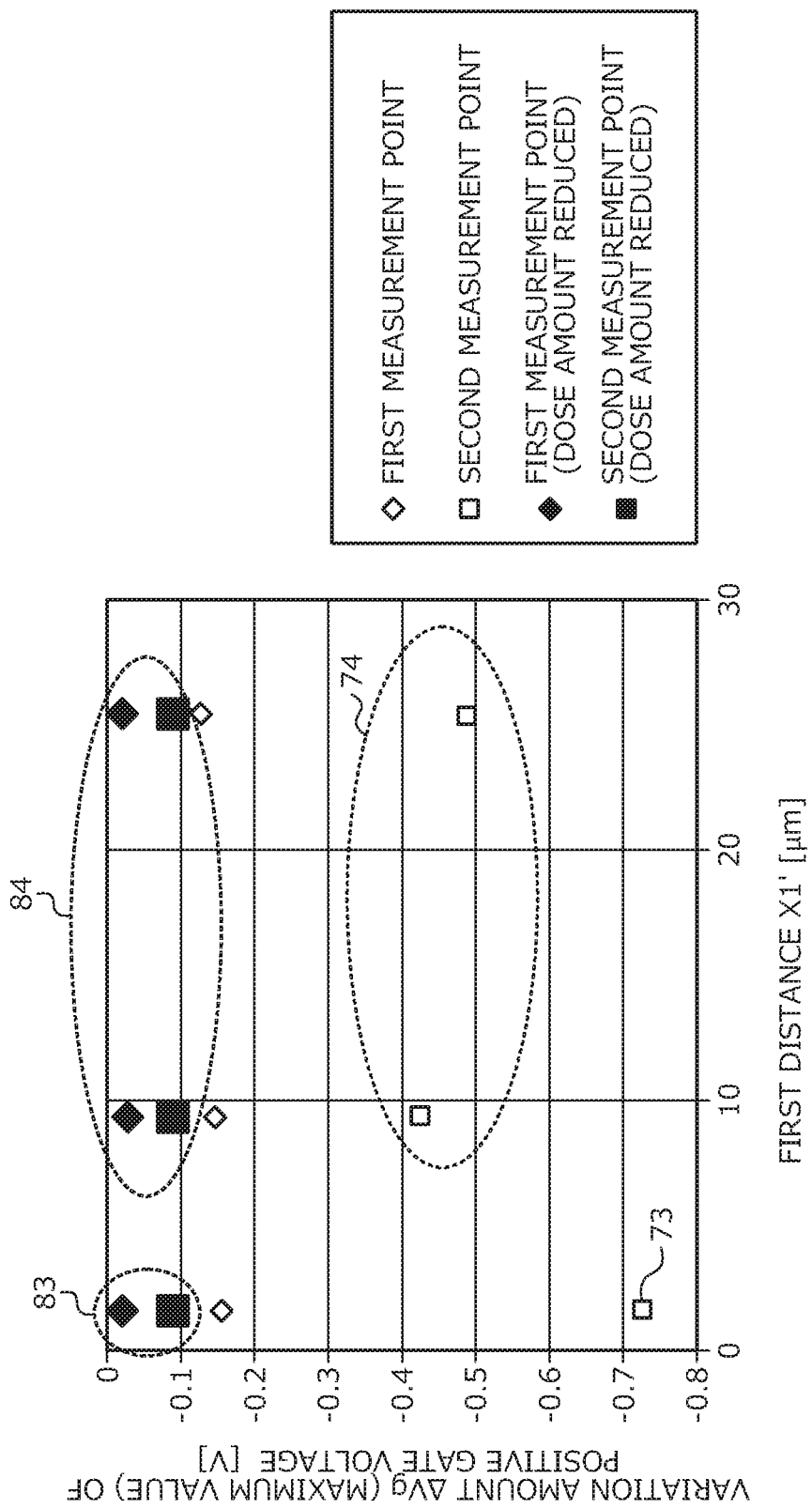
FIG. 14 is a characteristics diagram depicting results of verification regarding the dose amount of the p$^+$-type high-concentration region of a fourth example.

The dose amount of the p$^+$-type high-concentration region 51' of the silicon carbide semiconductor device according to the fourth embodiment was verified. FIG. 14 is a characteristics diagram depicting results of verification regarding the dose amount of the p$^+$-type high-concentration region of a fourth example. In FIG. 14, a horizontal axis is the first distance X1' along the first direction X from the p$^+$-type high-concentration region 51' to the n$^+$-type source region 24 and a vertical axis is maximum value of the amount of variation ΔVg of the positive gate voltage that occurs during a predetermined period when temporal changes of the positive gate voltage are observed. First, plural n-channel type MOSFETs having a trench gate structure that has the described structure of the silicon carbide semiconductor device according to the fourth embodiment were fabricated (hereinafter, fourth example).

The first distance X1' of a first sample 83 of the fourth example was similar to a sample of data point 73 of the second example. The second distance Y1 of the first sample 83 of the fourth example was set to be 1.6 μm. The dose amount of the p$^+$-type high-concentration region 51' of the first sample 83 of the fourth example was set to be ⅛ (=6.4×10$^{14}$/cm$^2$) of the dose amount (=5.15×10$^{15}$/cm$^2$) of the p$^+$-type high-concentration region 51 of the second example. The rated current of the first sample 83 of the fourth example was set to be equal to that in the second example. A dopant of the ion implantation 62 for forming the p$^+$-type high-concentration region 51' was similar to that of the second example.

Further, samples in which the dose amount of the p$^+$-type high-concentration region 51' was set to be ⅕ (=1.03×10$^{15}$/cm$^2$) of the dose amount of the p$^+$-type high-concentration region 51 of the second example were assumed as second samples 84 of the fourth example. The second samples 84 of the fourth example each differed from the samples of the data points 74 of the second example. Other than the first distance X1' and the dose amount of the p$^+$-type high-concentration region 51', configuration of the second samples 84 of the fourth example was similar to that of the first sample 83 of the fourth example.

With respect to the first and second samples 83, 84 of the fourth example, similarly to the second example, temporal changes from the time of the initial state of the positive gate voltage were respectively observed at the first and the second measurement points and results of comparison of maximum values of the amount of variation ΔVg of the positive gate voltage from the time of the initial state thereof, corresponding to the magnitudes of the drain current Id at the first and the second measurement points are depicted in FIG. 14. In FIG. 14, results (refer to FIG. 10) of the second example are indicated as "first and second measurement points" while results of the first and second samples 83, 84 of the fourth example are indicated as "first and second measurement points (dose amount reduced)".

From the results depicted in FIG. 14, it was confirmed that in the second samples 84, the amount of variation ΔVg from the time of the initial state of the positive gate voltage, corresponding to the magnitude of the drain current Id for the second measurement point, could be reduced from about −0.4V (samples of data points surrounded by circle indicated by reference numeral 74), which was the lowest effect obtained by the second example, to about −0.085V to 0.098V.

As described, according to the fourth embodiment, even when conditions of the p$^+$-type high-concentration region of the third embodiment are applied to the configuration of the silicon carbide semiconductor device according to the second embodiment, effects similar to those of the first and the second embodiments may be obtained.

Figure 15:
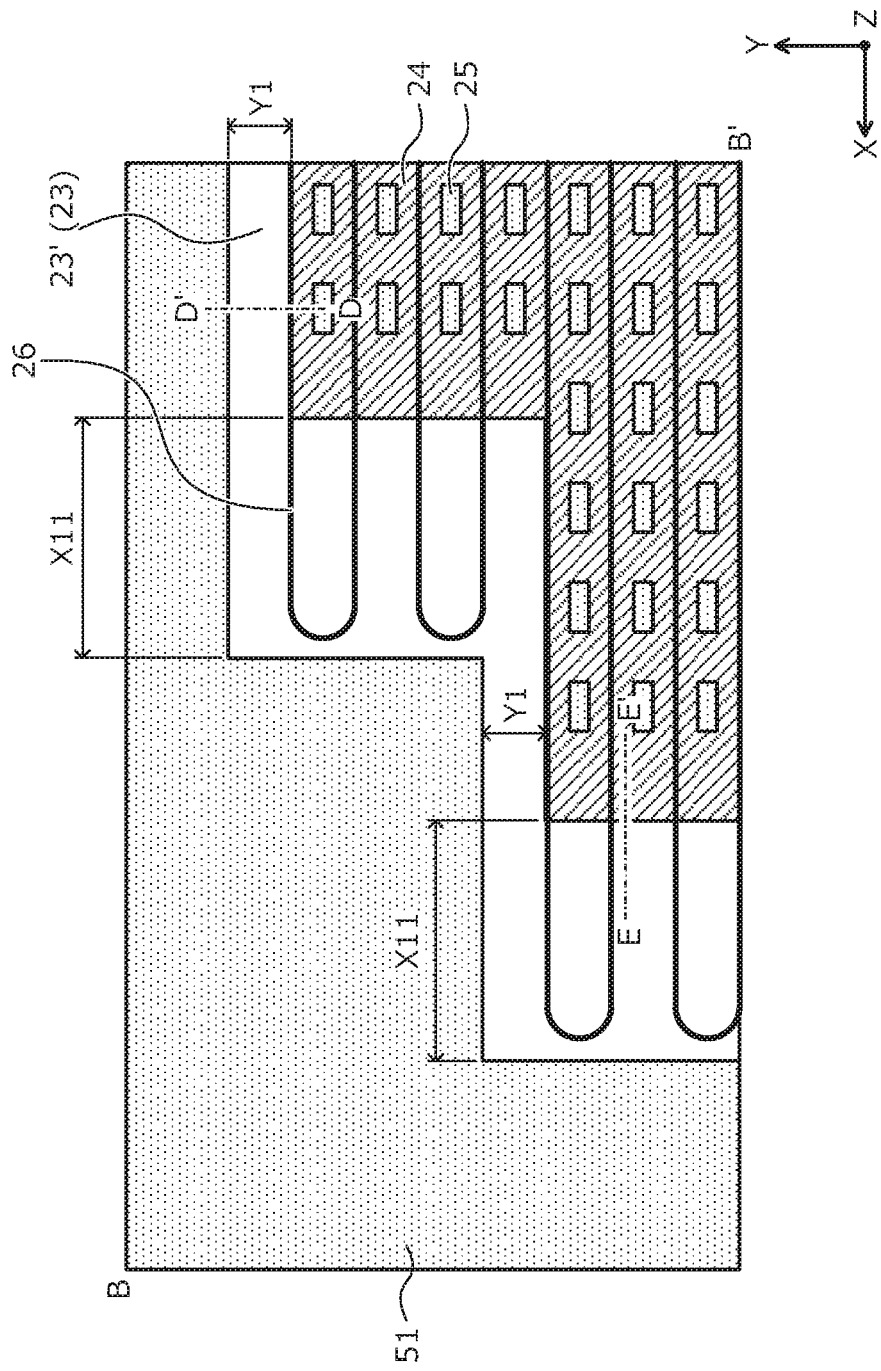
FIG. 15 is a plan view of a layout of a portion of the silicon carbide semiconductor device according to a fifth embodiment as viewed from the front surface of the semiconductor substrate.
Figure 16:
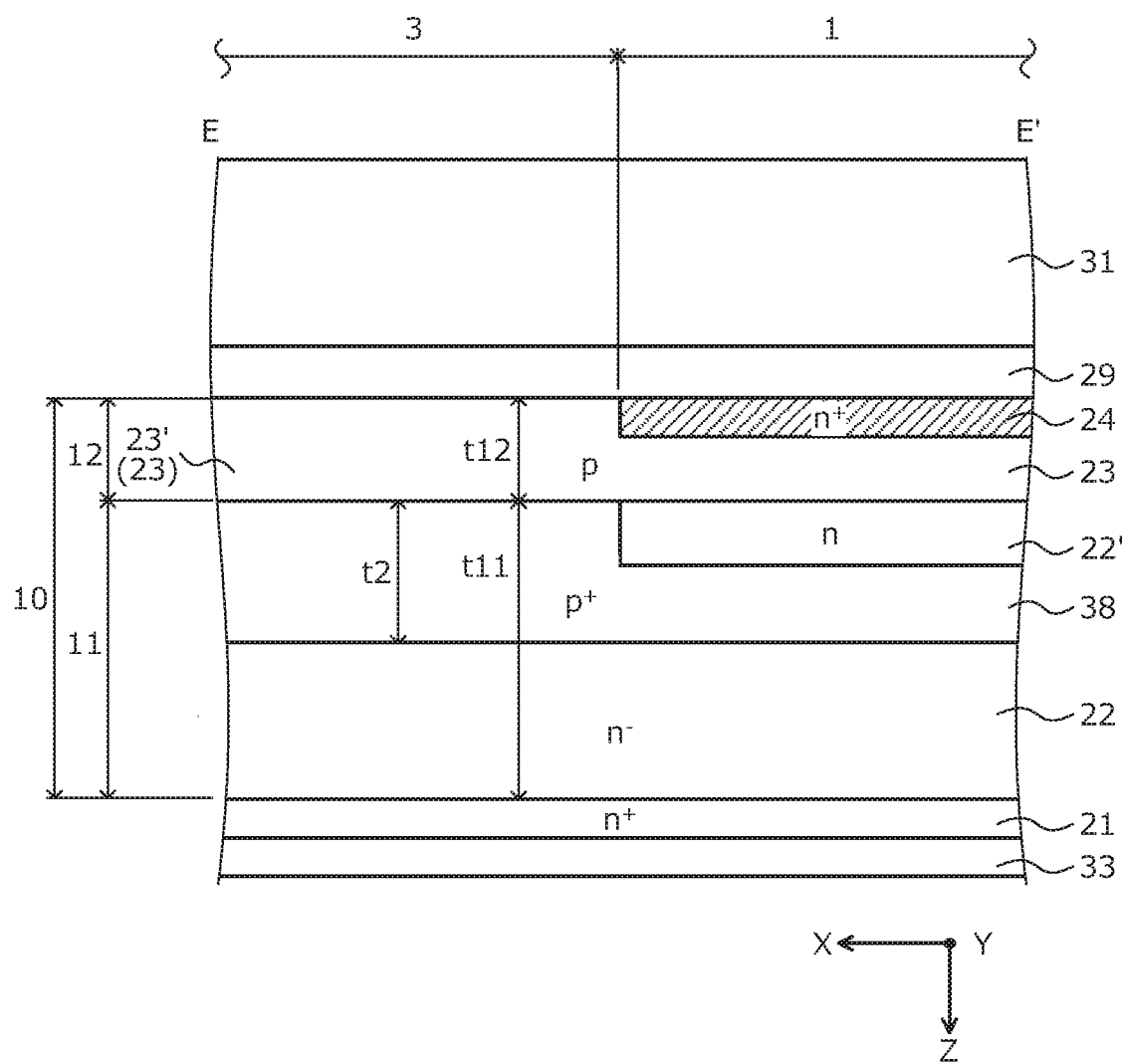
FIG. 16 is a cross-sectional view along cutting line E-E' in FIG. 15.

A structure of the silicon carbide semiconductor device according to a fifth embodiment will be described. FIG. 15 is a plan view of a layout of a portion of the silicon carbide semiconductor device according to the fifth embodiment as viewed from the front surface of the semiconductor substrate. In FIG. 15, a state of a region near the border between the active region 1 and the border region 3, near a corner of the semiconductor substrate 10 is depicted, the region being surrounded by a rectangular shaped frame formed by the vertices B, B' that are opposing vertices depicted in FIG. 1. Positions of the vertex B and the vertex B' with respect to the semiconductor substrate 10 are similar to those in the first embodiment. A cross-sectional view along cutting line D-D' in FIG. 15 is similar to that depicted in FIG. 5. FIG. 16 is a cross-sectional view along cutting line E-E' in FIG. 15.

The silicon carbide semiconductor device according to the fifth embodiment differs from the silicon carbide semiconductor device according to the second embodiment in that the trench 26 that extends outward along the first direction X from the active region 1 does not reach the p$^+$-type high-concentration region 51. In other words, an end of the trench 26, along the first direction X, terminates in a portion of the p-type base region extended portion 23' between the p$^+$-type high-concentration region 51 and the n$^+$-type source region 24. A length that the trench 26 extends outward along the first direction X from the active region 1 may be variously modified, and a first distance X11 from the p$^+$-type high-concentration region 51 to the n$^+$-type source region 24 suffices to be made as long as an amount that the trench 26 is extended outward along the first direction X, so that the trench 26 does not reach the p$^+$-type high-concentration region 51.

The condition of the p$^+$-type high-concentration region of the fourth embodiment may be applied to the configuration of the silicon carbide semiconductor device according to the fifth embodiment.

As described, according to the fifth embodiment, effects similar to those of the first to the fourth embodiments may be obtained irrespective of a termination position of the trench that extends outward from the active region, along the first direction.

Figure 17:
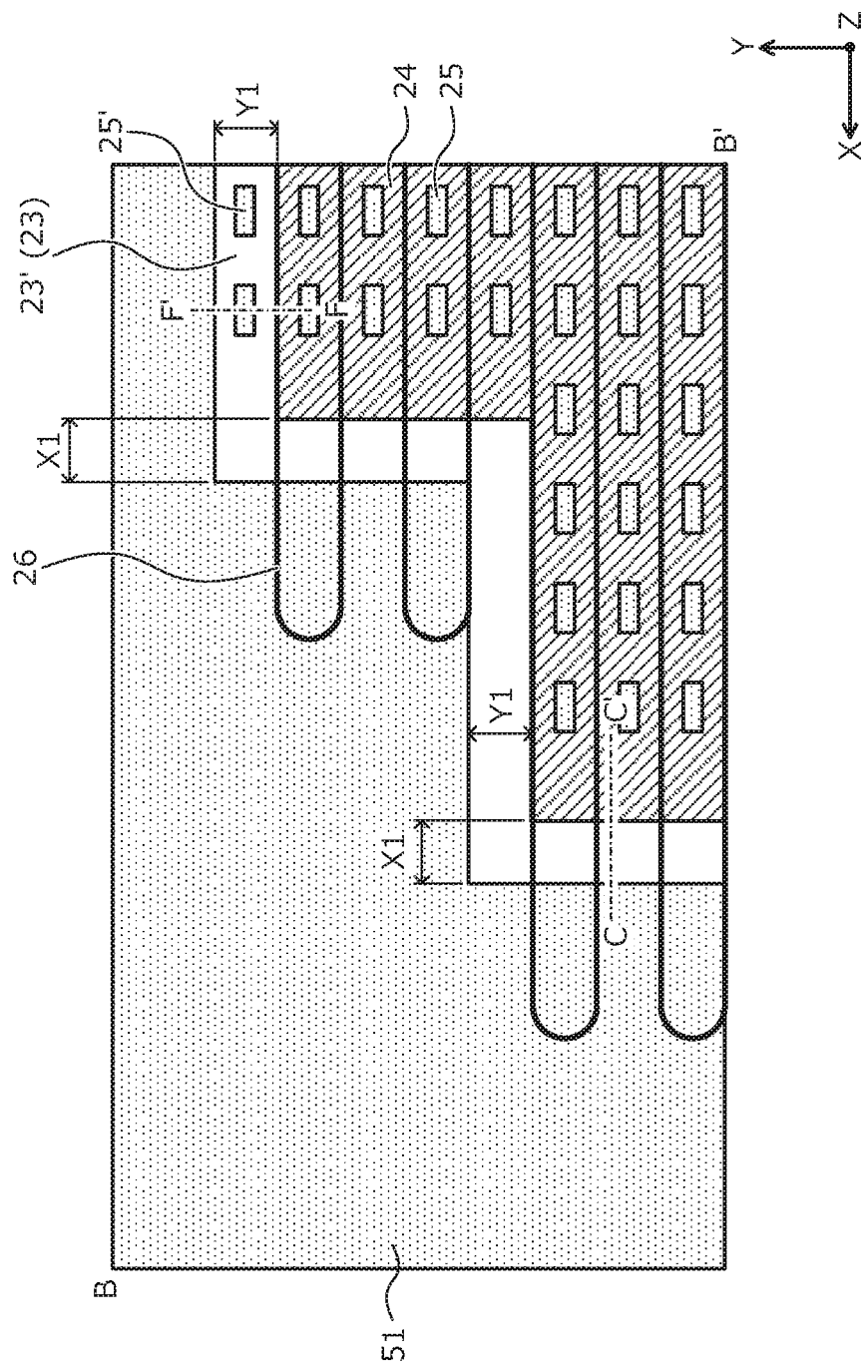
FIG. 17 is a plan view of a layout of a portion of the silicon carbide semiconductor device according to a sixth embodiment as viewed from the front surface of the semiconductor substrate.
Figure 18:
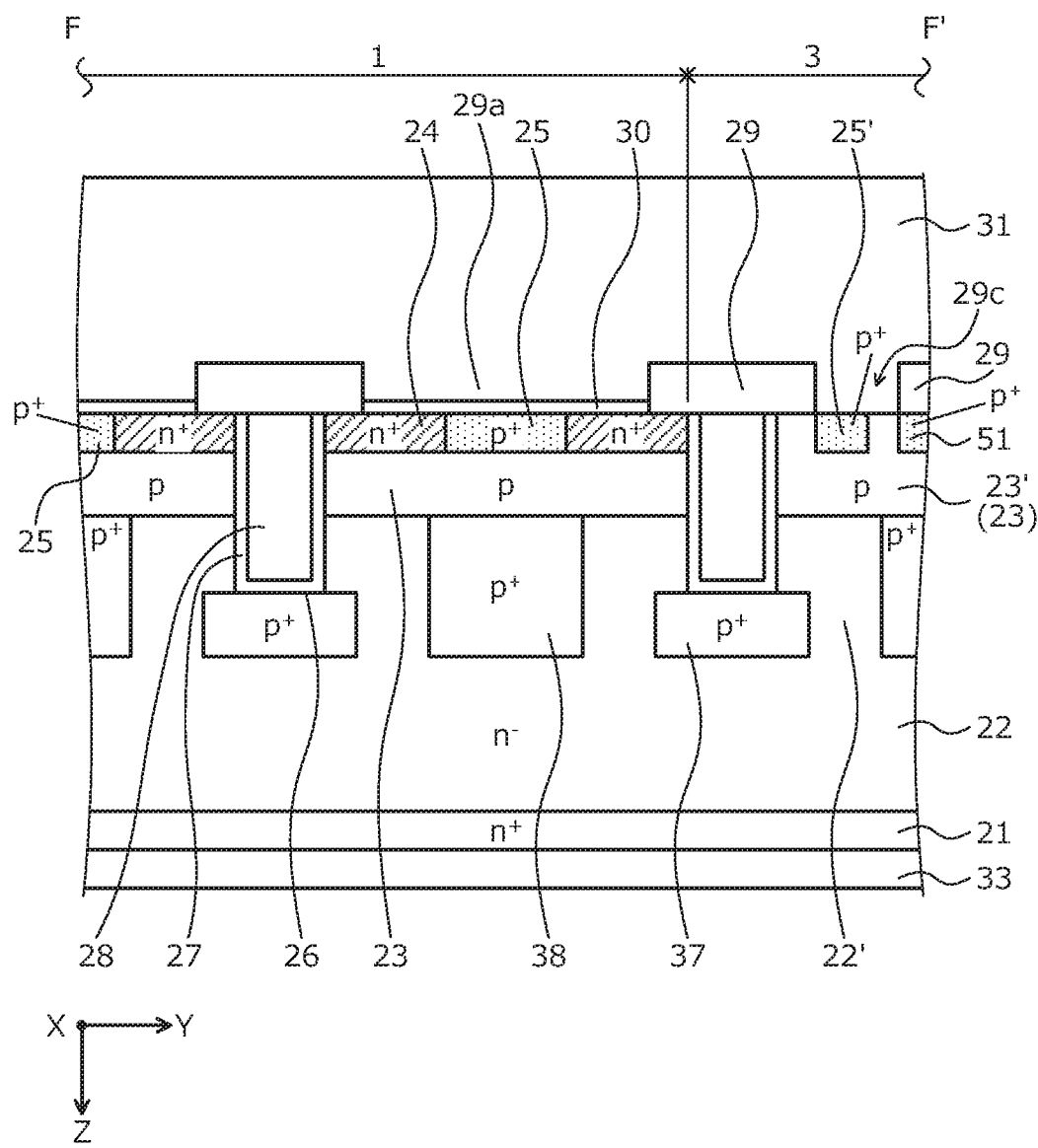
FIG. 18 is a cross-sectional view along cutting line F-F' in FIG. 17.

A structure of the silicon carbide semiconductor device according to a sixth embodiment will be described. FIG. 17 is a plan view of a layout of a portion of the silicon carbide semiconductor device according to the sixth embodiment as viewed from the front surface of the semiconductor substrate. In FIG. 17, a state of a region near the border between the active region 1 and the border region 3, near a corner of the semiconductor substrate 10 is depicted, the region being surrounded by a rectangular frame formed by that are opposing vertices depicted in FIG. 1. Positions of the vertex B and the vertex B' with respect to the semiconductor substrate 10 are similar to those in the first embodiment. A cross-section along cutting line C-C' in FIG. 15 is similar to that in FIG. 4. FIG. 18 is a cross-sectional view along cutting line F-F' in FIG. 17.

The silicon carbide semiconductor device according to the sixth embodiment differs from the silicon carbide semiconductor device according to the first embodiment in that a second p$^+$-type contact region (fifth semiconductor region) 25' is disposed at a portion of the p-type base region extended portion 23' exposed at the front surface 13a of the semiconductor substrate 10. In particular, the portion of the p-type base region extended portion 23' between the p$^+$-type high-concentration region 51 and the n$^+$-type source region 24 along the first direction X, or a portion between the p$^+$-type high-concentration region 51 and the trench 26 that is outermost, along the second direction Y, or in both portions, the second p$^+$-type contact region 25' is selectively provided.

FIG. 17 depicts a state in which the second p$^+$-type contact region 25' is provided dispersed at a predetermined interval along the first direction X, only in a portion of the p-type base region extended portion 23' between the p$^+$-type high-concentration region 51 and the trench 26 that is outermost, along the second direction Y. While not depicted, when the second p$^+$-type contact region 25' is disposed in a portion of the p-type base region extended portion 23' between the p$^+$-type high-concentration region 51 and the n$^+$-type source region 24 along the first direction X, for example, the second p$^+$-type contact region 25' suffices to be disposed dispersed along the first direction X at a predetermined interval that is a same as that of the p$^+$-type contact region (hereinafter, first p$^+$-type contact region) 25 of the active region 1.

The second p$^+$-type contact region 25' may be in contact with the p$^+$-type high-concentration region 51. Conditions (impurity concentration, dimension, etc.) of the second p$^+$-type contact region 25' are similar to those of the first p$^+$-type contact region 25. The second p$^+$-type contact region 25', in the border region 3, is exposed by a third contact hole 29c that penetrates the interlayer insulating film 29 in the depth direction Z. In the third contact holes 29c, respectively differing second p$^+$-type contact regions 25' are exposed. The second p$^+$-type contact regions 25', similarly to the first p$^+$-type contact regions 25, form contacts that exhibit an ohmic property with the metal films 30 in the third contact holes 29c.

The source electrode 31 is electrically connected to the second p$^+$-type contact regions 25' via the metal films 30 in the third contact holes 29c and is electrically connected to the p-type base region extended portion 23' via the second p$^+$-type contact regions 25'. While provision of the second p$^+$-type contact regions 25' slightly lowers the effect of reducing the amount of variation $\Delta$Vg from the time of the initial state of the gate voltage Vg, corresponding to a predetermined magnitude of the drain current Id, a p-type impurity concentration of the p-type base region extended portion 23' increases, thereby reducing the resistance and enabling avalanche capability to be enhanced. Therefore, the second p$^+$-type contact region 25' is suitably disposed so that the amount of variation $\Delta$Vg from the time of the initial state of the gate voltage Vg, corresponding to a predetermined magnitude of the drain current Id and the avalanche capability become predetermined values.

The configuration of the second p$^+$-type contact region of the sixth embodiment may be suitably applied to the silicon carbide semiconductor devices according to the second to fifth embodiments.

As described, according to the sixth embodiment, even when the second p$^+$-type contact region is disposed in a portion of the p-type base region extended portion exposed at the front surface of the semiconductor substrate, effects similar to those of the first to fifth embodiments may be obtained. Further, according to the sixth embodiment, resistance of the p-type base region extended portion is reduced by the provision of the p$^+$-type contact region in the p-type base region extended portion. As a result, hole current (hereinafter, avalanche current) that flows from the edge terminating region toward the active region due to avalanche breakdown during the OFF state may also flow along a path from the second p$^+$-type contact region toward the source electrode, via the third contact holes. Therefore, the avalanche capability may be enhanced.

Figure 19:
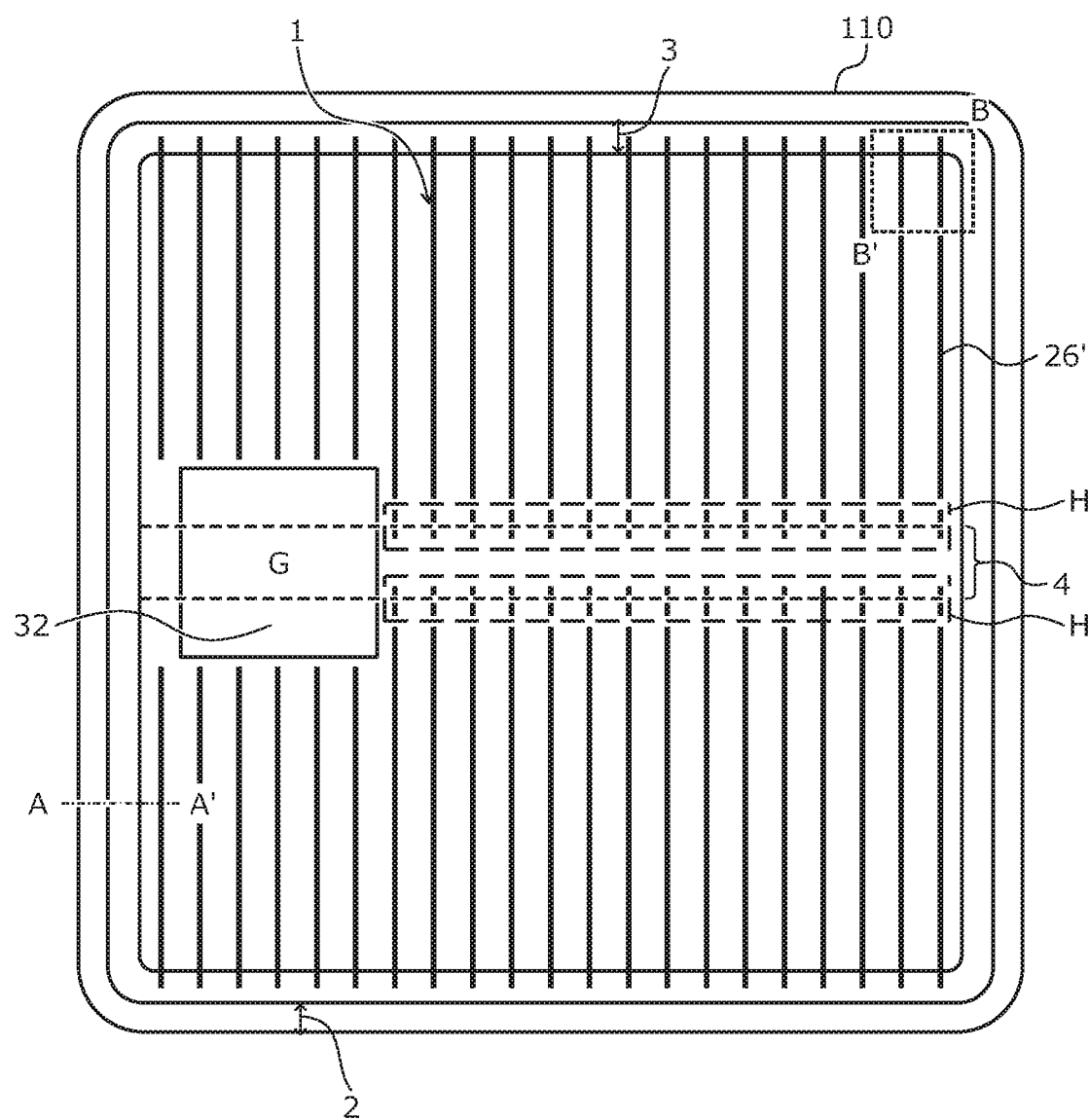
FIG. 19 is a plan view of a layout of a portion of the silicon carbide semiconductor device according to a seventh embodiment as viewed from the front surface of the semiconductor substrate.

A structure of the silicon carbide semiconductor device according to a seventh embodiment will be described. FIG. 19 is a plan view of a layout of a portion of the silicon carbide semiconductor device according to the seventh embodiment as viewed from the front surface of the semiconductor substrate. The silicon carbide semiconductor device according to the seventh embodiment differs from the silicon carbide semiconductor device according to the first embodiment in that a first end of the trench 26' terminates the active region 1. For example, two sets of the trenches 26' that extend in a striped shape along the first direction X may be disposed separated from each other so as to be adjacent along the first direction X in the active region 1.

The first end of the trench 26' terminates in, for example, a center portion of the active region 1 while a second end thereof terminates in the border region 3. The center portion of the active region 1 is an inactive region 4 constituted by a p$^+$-type high-concentration region. A region of the active region 1 excluding the inactive region 4 is an effective region. The inactive region 4 is a region that does not function as a MOSFET and the effective region is a region that functions as a MOSFET. A method of forming the p$^+$-type high-concentration region of the inactive region 4 is similar to that for forming the p$^+$-type high-concentration region of the border region 3.

Also in a vicinity H of the first end of the trench 26', the first end that terminates in the active region 1 and similarly to the first embodiment, the p$^+$-type high-concentration region of the inactive region 4 is disposed separated from the n$^+$-type source region. Along the first direction X, a condition of a distance from the p$^+$-type high-concentration region of the inactive region 4 to the n$^+$-type source region is equal to the first distance from the p$^+$-type high-concentration region of the border region 3 to the n$^+$-type source region, along the first direction X. A configuration of the trench 26' near the second end thereof that terminates in the border region 3 is similar to that in the first embodiment.

The configuration of the trench of the seventh embodiment may be applied to the configuration of the silicon carbide semiconductor devices according to the second to sixth embodiments.

As described, according to the seventh embodiment, at the end of the trench constituting the trench gate structure, the p$^+$-type high-concentration region is disposed separated from the n$^+$-type source region, enabling effects similar to those of the first to sixth embodiments to be obtained.

Drain cutoff current (leak current) Idss of the silicon carbide semiconductor device according to the third embodiment was verified. The drain cutoff current Idss is the drain current Id when voltage Vd between the source and drain is applied in a state of short-circuit between the gate and source (i.e., a state of the gate voltage Vg=0V). First, an n-channel type MOSFET having a trench gate structure that has the described structure of the silicon carbide semiconductor device according to the third embodiment was fabricated (hereinafter, fifth example).

In the fifth example, the first distance X1 was set to be sufficiently long at about 0.6 μm, the aluminum dose amount of the p$^+$-type high-concentration region 51' was set to be 6.4×10$^{14}$/cm$^2$, which is lower than in the conventional structure, and the gate threshold voltage Vth set to be low at about 3V. With respect to the fifth example, the drain cutoff current Idss was measured when the gate voltage Vg was set to be 0V and the voltage Vd between the source and drain was set to be 600V. Further, for comparison, with respect to the conventional structure (refer to FIGS. 21 to 25) as well, the drain cutoff current Idss was measured under the same conditions as the fifth example.

In the conventional structure, the drain cutoff current Idss was confirmed to vary greatly from 100 pA to 100 μA over time. In contrast, in the fifth example, variation of the drain cutoff current Idss over time was about 100 pA to 1 nA. In other words, even when the aluminum dose amount of the p$^+$-type high-concentration region 51' was reduced, it was confirmed that the drain cutoff current Idss could be reduced to a level that did not cause problems.

With respect to the silicon carbide semiconductor device according to the fourth embodiment as well, effects similar to those of the fifth example are obtained.

Figure 20:
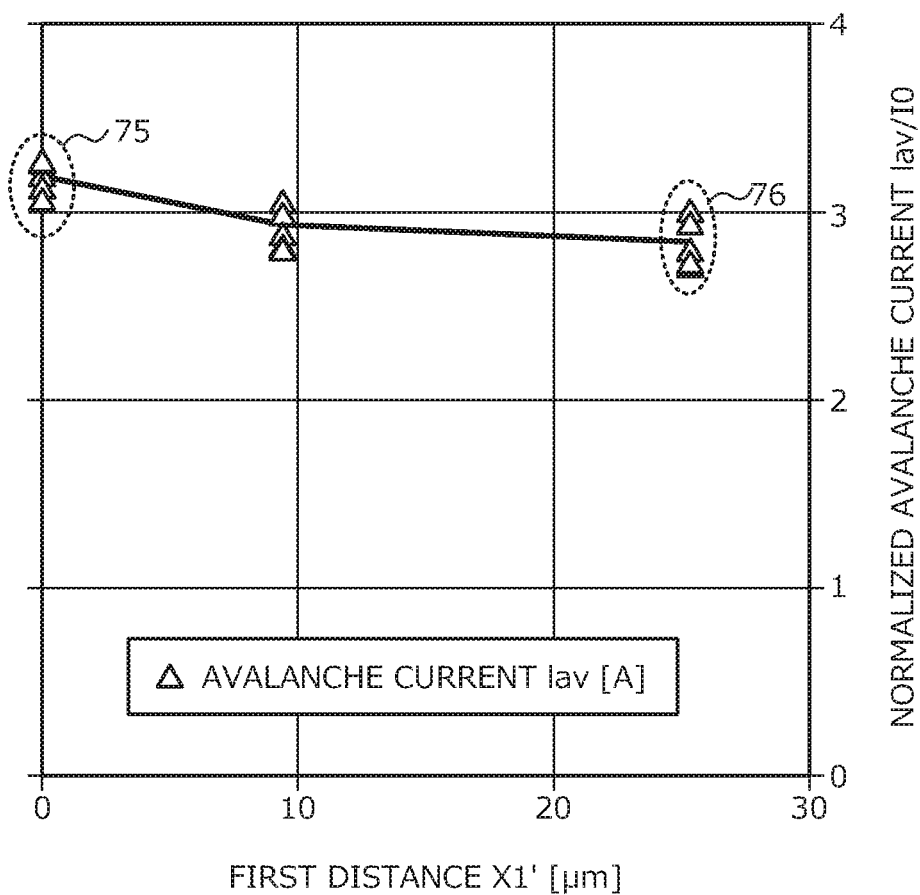
FIG. 20 is a characteristics diagram depicting a relationship between the first distance of a sixth example and normalized avalanche current Iav/I0.
Figure 21:
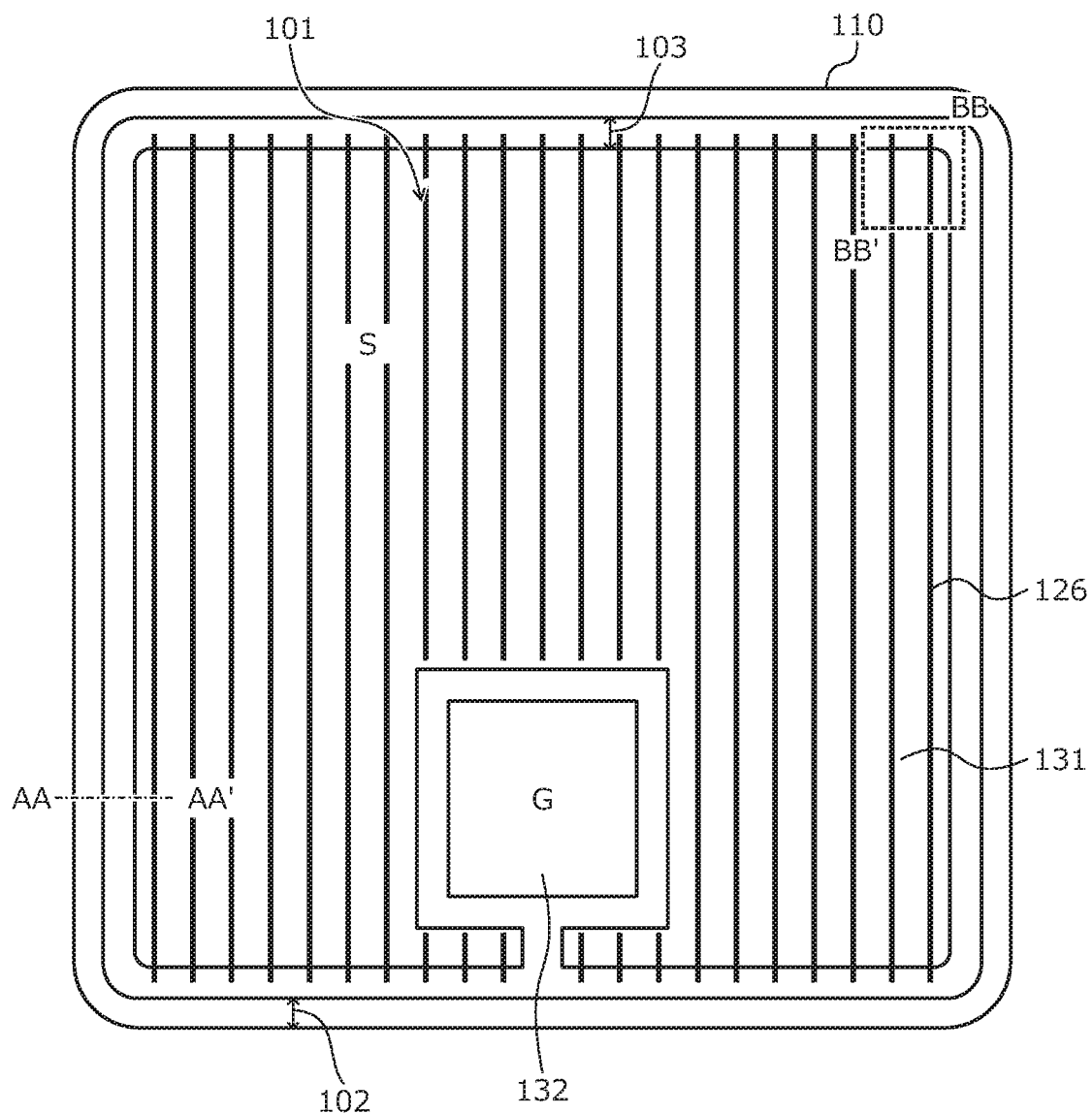
FIG. 21 is a plan view of a layout of a conventional silicon carbide semiconductor device as viewed from a front surface side of a semiconductor substrate.
Figure 22:
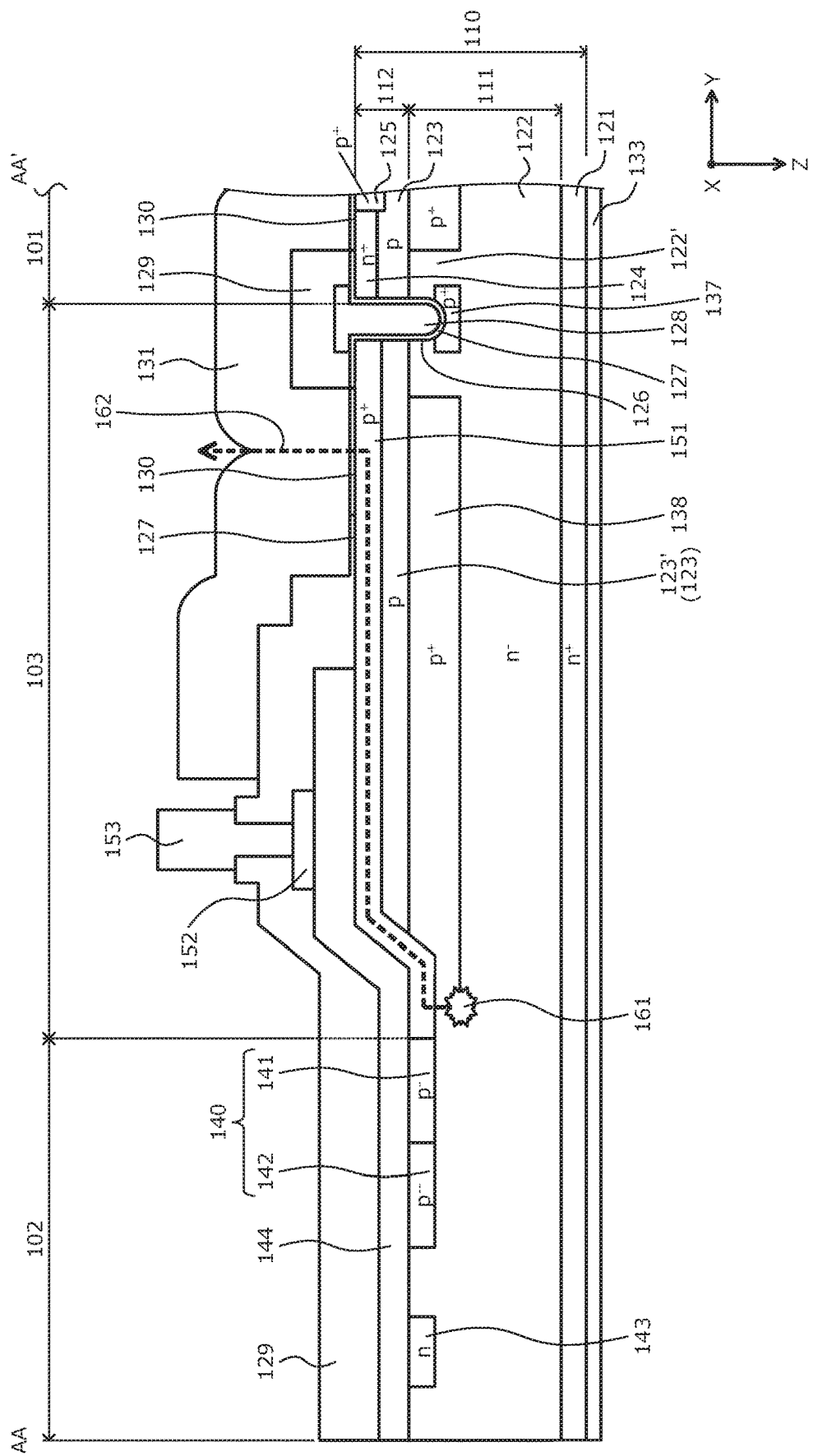
FIG. 22 is a cross-sectional view of a structure along cutting line AA-AA' in FIG. 21.
Figure 23:
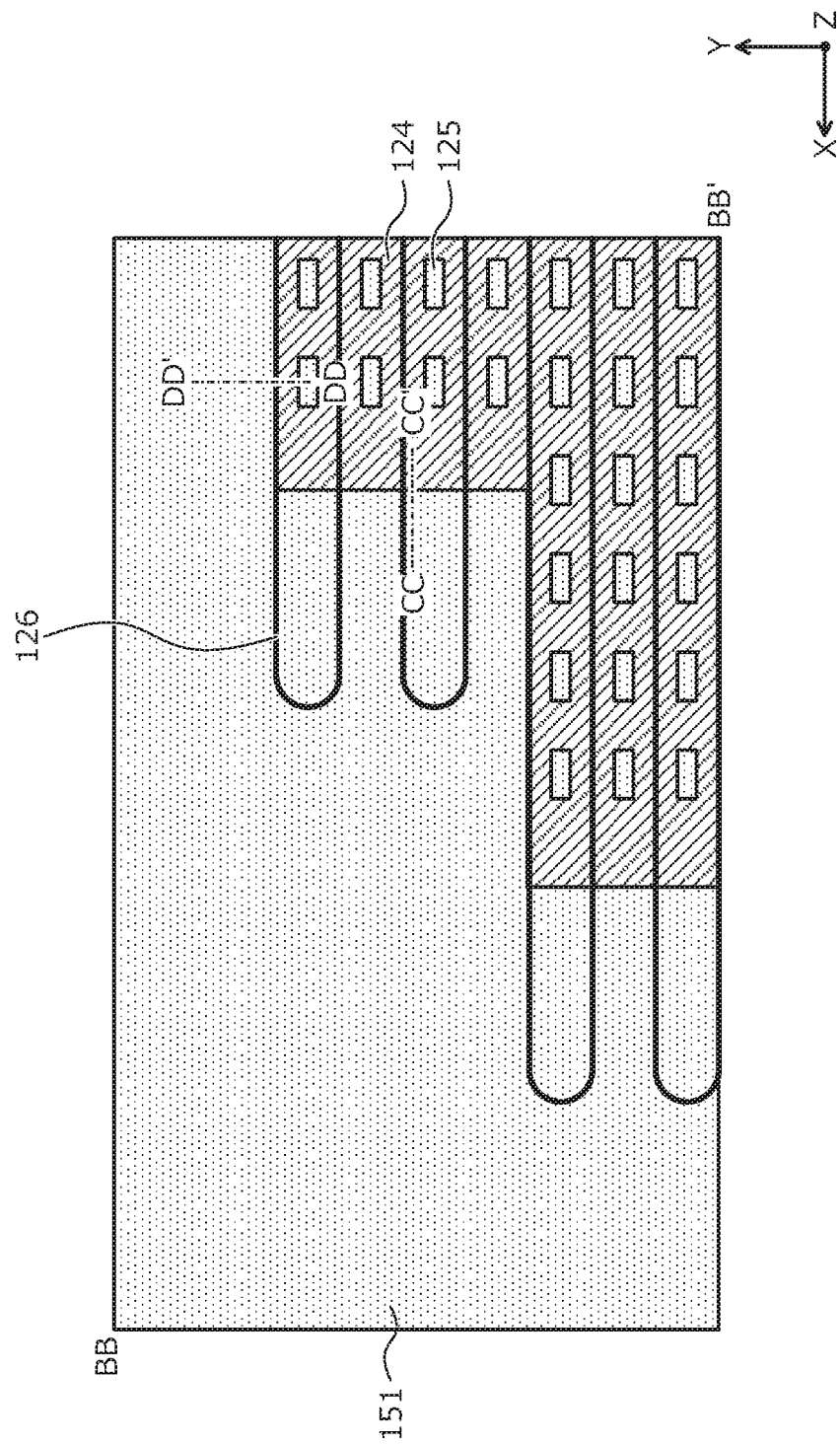
FIG. 23 is an enlarged plan view of a portion of FIG. 21.
Figure 24:
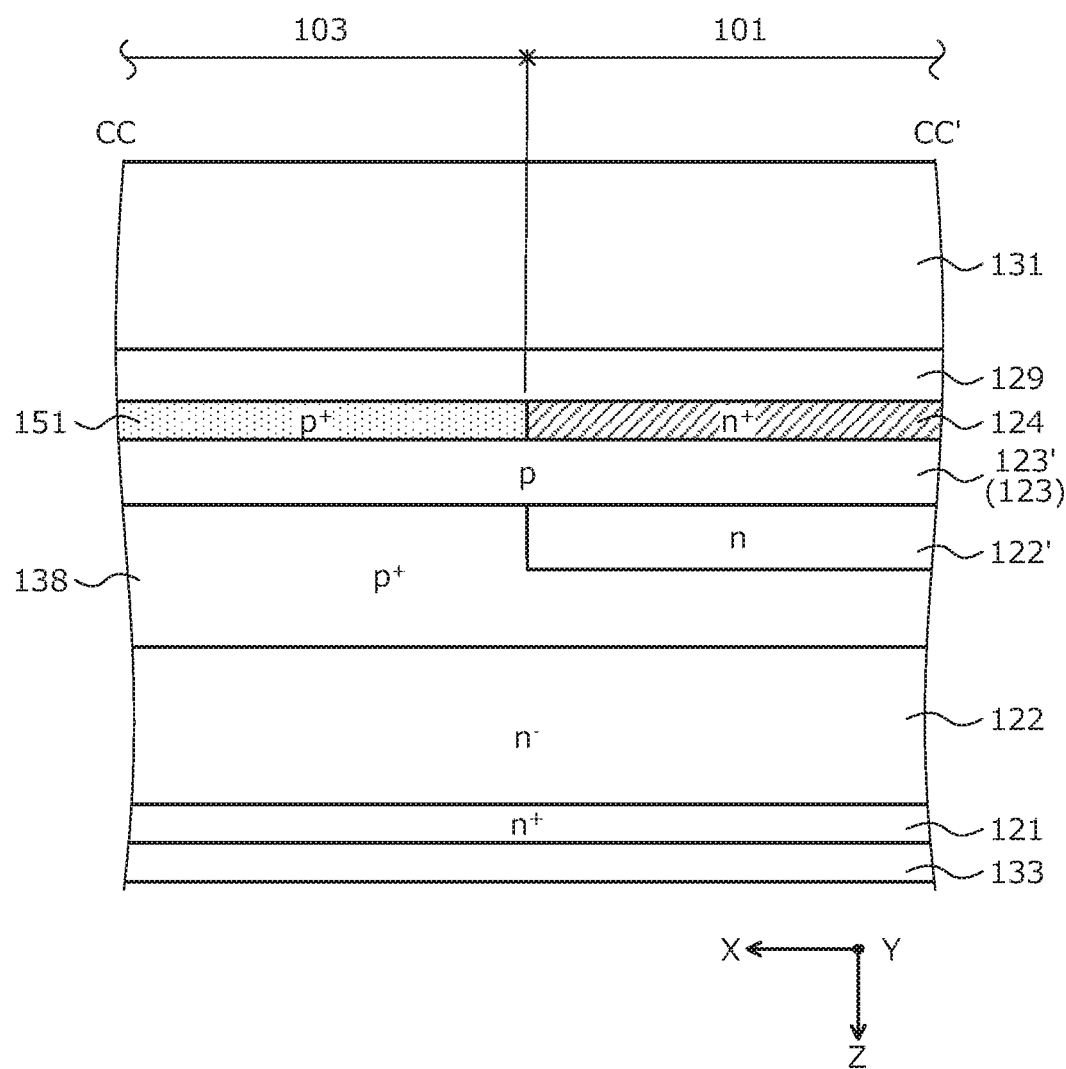
FIG. 24 is a cross-sectional view along cutting line CC-CC' in FIG. 23.
Figure 25:
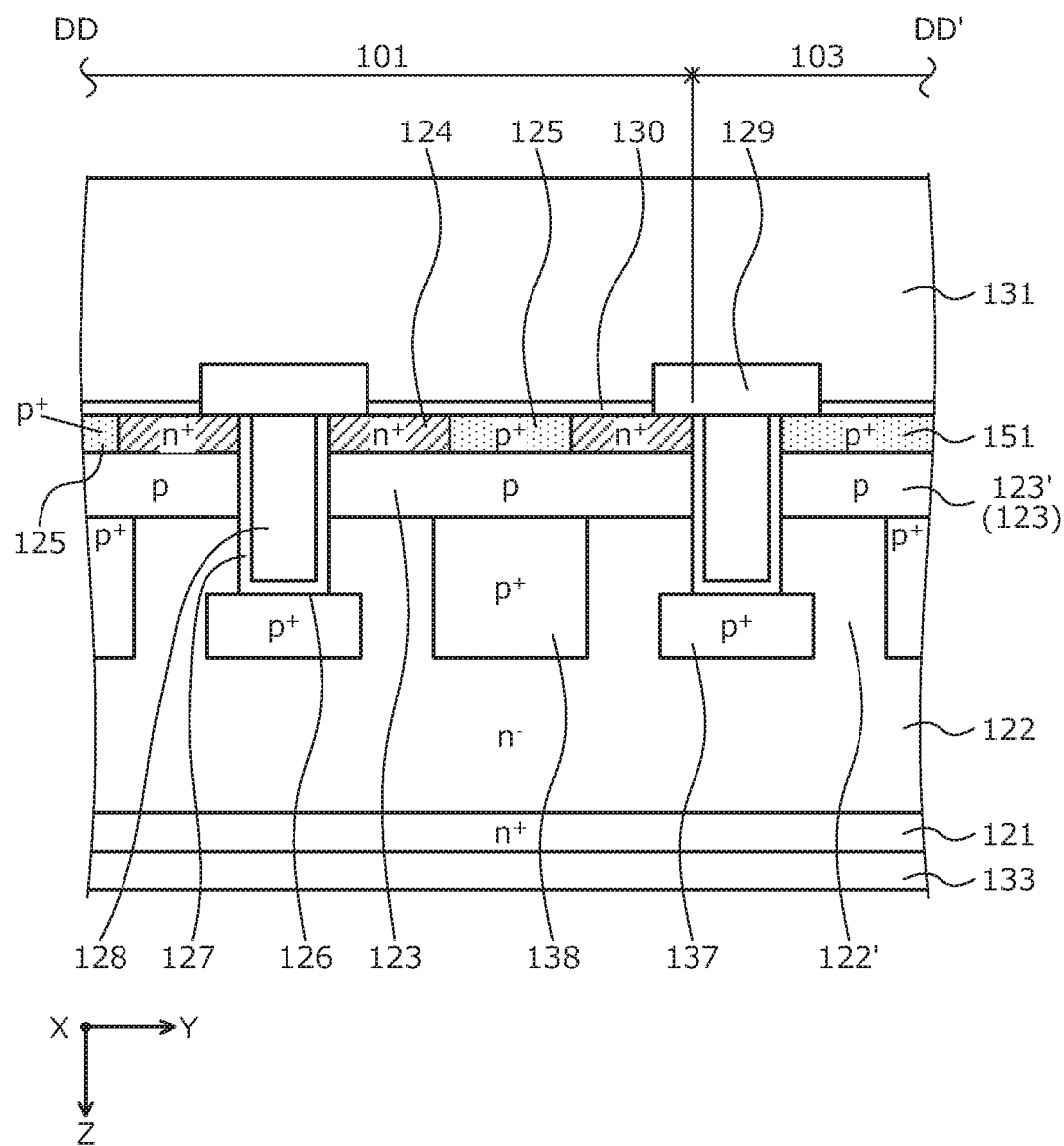
FIG. 25 is a cross-sectional view along cutting line DD-DD' in FIG. 23.

The magnitude of hole current (avalanche current) Iav that flows from the edge terminating region 2 toward the active region 1 due to avalanche breakdown that occurs in the OFF state of the silicon carbide semiconductor device according to the second embodiment described above was verified. FIG. 20 is a characteristics diagram depicting a relationship between the first distance of a sixth example and normalized avalanche current Iav/I0 (where, I0 is the rated current). In FIG. 20, a horizontal axis is the first distance X1' from the p$^+$-type high-concentration region 51 to the n$^+$-type source region 24 along the first direction X and a vertical axis is normalized avalanche current Iav/I0.

First, plural n-channel type MOSFETs having a trench gate structure that has the structure of the silicon carbide semiconductor device according to the second embodiment described above were fabricated (hereinafter, sixth example). In samples of the sixth example, the first distance X1' was 0 μm, 9.35 μm, and 26 μm, respectively. With respect to the samples of the sixth example, avalanche current Iav that occurs due to avalanche breakdown in the OFF state was measured. Results are depicted in FIG. 20. In FIG. 20, the sample in which the first distance X1' was 0.0 μm corresponds to the conventional structure.

From the results depicted in FIG. 20, in the sixth example, while the normalized avalanche current Iav/I0 decreased from 3.16 (sample of data points surrounded by circle indicated by reference numeral 75) of the conventional structure to 2.84 (samples of data points surrounded by circle indicated by reference numeral 76), the normalized avalanche current Iav/I0 was two times the rated current, that is, a level that does not cause problems in actual use.

Although not depicted, effects similar to those of the sixth example may be obtained by the silicon carbide semiconductor devices according to the first and third to seventh embodiments.

The present invention is not limited to the embodiments discussed herein and various modifications are possible within a range that does not depart from the spirit of the invention. For example, in the embodiments above, while description is given taking a MOSFET as an example, application is further possible to a MOS silicon carbide semiconductor device having a trench gate structure such as, for example, an IGBT. Further, the present invention is similarly implemented when conductivity types (n-type, p-type) are reversed.

According to the present invention described, when negative gate bias is applied to the gate electrode under high-temperature conditions, holes may be suppressed from accumulating at the interface between the third semiconductor region and the gate insulating film. As a result, when positive gate voltage that is equal to or greater than the gate threshold voltage is applied to the gate electrode, the gain curve of current that flows from the fourth semiconductor region toward the first semiconductor region may be suppressed from being shifted in a negative direction of the gate voltage as compared to the initial state.

The silicon carbide semiconductor device according to the present invention achieves an effect in that under high temperatures (about 200 degrees C. or higher), current controllability by gate voltage control may be enhanced.

As described, the silicon carbide semiconductor device according to the present invention is useful for power semiconductor devices used in, for example, power converting equipment such as inverters, power supply devices of various industrial machines, automotive igniters, etc. and in particular, is suitable for n-channel-type silicon carbide semiconductor devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, including
an active region through which main current flows,
a termination region surrounding a periphery of the active region, and
a border region between the active region and the termination region, and surrounding the periphery of the active region,
the silicon carbide semiconductor device comprising:
a semiconductor substrate having a first main surface and a second main surface, the semiconductor substrate including
a first epitaxial layer of a first conductivity type, and
a second epitaxial layer of a second conductivity type, the second epitaxial layer forming the first main surface of the semiconductor substrate, and including
a first semiconductor region of the first conductivity type, selectively provided in a surface layer of the second epitaxial layer, at a side of the first main surface, in the active region,
a second semiconductor region of the second conductivity type, selectively provided in the surface layer of the second epitaxial layer, at the side of the first main surface, in the border region, the second semiconductor region having an impurity concentration that is higher than that of the second epitaxial layer, and
a third semiconductor region constituted by the second epitaxial layer excluding the first semiconductor region and the second semiconductor region;
a trench penetrating the first semiconductor region and the third semiconductor region, and reaching the first epitaxial layer;
a gate electrode provided in the trench, via a gate insulating film;
a first electrode electrically connected to the first semiconductor region and the third semiconductor region;
a second electrode provided at the second main surface of the semiconductor substrate; and
an interlayer insulating film disposed between the first electrode and the first main surface of the semiconductor substrate in the border region, wherein
the trench is disposed in plurality,
the second semiconductor region in the border region is separate from the first semiconductor region in the active region and from an outermost trench, and continuously extends from the border region to reach the termination region, and
a plurality of portions of the third semiconductor region are exposed at the first main surface of the semiconductor substrate in the border region, one of the plurality portions being located between the second semiconductor region and the first semiconductor region, another one of the plurality of portions being located between the second semiconductor region and the outermost trench, the second semiconductor region and the plurality of portions of the third semiconductor region being entirely and directly covered by an insulating layer including one of the gate insulating film or the interlayer insulating film.

2. The silicon carbide semiconductor device according to claim 1, wherein
each trench extends linearly along a first direction that is parallel to the first main surface of the semiconductor substrate, and
the second semiconductor region, at an end of said each trench along the first direction, is separate from the first semiconductor region.

3. The silicon carbide semiconductor device according to claim 2, wherein a first distance along the first direction, from the second semiconductor region to the first semiconductor region, is at least 0.6 µm.

4. The silicon carbide semiconductor device according to claim 2, wherein
said each trench has a stripe shape extending along the first direction from the active region into the border region, wherein
the first semiconductor region is disposed between adjacent ones of the plurality of trenches,
the second semiconductor region is separate from the outermost trench, which is one of the plurality of trenches that is closest to the border region along a second direction that is parallel to the first main surface of the semiconductor substrate and orthogonal to the first direction.

5. The silicon carbide semiconductor device according to claim 4, wherein
a second distance along the second direction, from the second semiconductor region to the outermost trench, is at least 0.6 µm.

6. The silicon carbide semiconductor device according to claim 5, wherein
a first distance along the first direction, from the second semiconductor region to the first semiconductor region, is at least 9.35 µm.

7. The silicon carbide semiconductor device according to claim 2, wherein
said each trench extends from the active region into the border region and terminates at a position that is closer to the active region than is the second semiconductor region.

8. The silicon carbide semiconductor device according to claim 1, wherein
said each trench has a stripe shape extending from the active region into the border region, along a first direction that is parallel to the first main surface of the semiconductor substrate,
the first semiconductor region is disposed between adjacent ones of the plurality of trenches,
the second semiconductor region is separate from the outermost trench, which is one of the plurality of trenches that is closest to the border region along a second direction that is parallel to the first main surface of the semiconductor substrate and orthogonal to the first direction.

9. The silicon carbide semiconductor device according to claim 8, wherein
a second distance along the second direction, from the second semiconductor region to the outermost trench, is at least 0.6 µm.

10. The silicon carbide semiconductor device according to claim 1, wherein the impurity concentration of the second semiconductor region is at most $6.4 \times 10^{14}/cm^2$.

11. The silicon carbide semiconductor device according to claim 1, further comprising
a fifth semiconductor region of the second conductivity type, selectively provided in the portion of the third semiconductor region exposed at the first main surface of the semiconductor substrate, the fifth semiconductor region having an impurity concentration that is higher than that of the third semiconductor region, wherein
the third semiconductor region is electrically connected to the first electrode via the fifth semiconductor region.

12. The silicon carbide semiconductor device according to claim 11, wherein
the fifth semiconductor region is a diffusion region formed by ion implanting an impurity of the second conductivity type in the second epitaxial layer.

13. The silicon carbide semiconductor device according to claim 1, wherein
the second semiconductor region is a diffusion region formed by ion implanting an impurity of the second conductivity type in the second epitaxial layer.

* * * * *